United States Patent
Yamazaki

(10) Patent No.: US 9,368,516 B2
(45) Date of Patent: Jun. 14, 2016

(54) DISPLAY DEVICE AND ELECTRONIC APPLIANCE

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/692,067

(22) Filed: Apr. 21, 2015

(65) Prior Publication Data

US 2015/0228676 A1   Aug. 13, 2015

Related U.S. Application Data

(63) Continuation of application No. 14/018,770, filed on Sep. 5, 2013, now Pat. No. 9,018,624.

(30) Foreign Application Priority Data

Sep. 13, 2012 (JP) ................ 2012-202123

(51) Int. Cl.
*H01L 29/10* (2006.01)
*H01L 27/12* (2006.01)
(Continued)

(52) U.S. Cl.
CPC ........ *H01L 27/1225* (2013.01); *H01L 27/1255* (2013.01); *H01L 27/3262* (2013.01); *H01L 27/3265* (2013.01); *H01L 29/7869* (2013.01); *H01L 2227/323* (2013.01)

(58) Field of Classification Search
CPC ............ H01L 27/1225; H01L 27/1255; H01L 27/3262; H01L 7/3265; H01L 29/78669; H01L 29/7869; G02F 1/136213
USPC ........................................................ 257/43
See application file for complete search history.

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

EP   1737044 A   12/2006
EP   2226847 A   9/2010
(Continued)

OTHER PUBLICATIONS

Nakayama et al., "17a-TL-8 Effect of GaO Layer on IGZO-TFT Channel", Extended Abstracts (The 57th Spring Meeting 2010). The Japan Society of Applied Physics and Related Societies, Mar. 17, 2010, pp. 21-008.
(Continued)

*Primary Examiner* — Tu-tu Ho
(74) *Attorney, Agent, or Firm* — Robinson Intellectual Property Law Office; Eric J. Robinson

(57) ABSTRACT

A display device with low manufacturing cost, a display device with low power consumption, a display device capable of being formed over a large substrate, a display device with a high aperture ratio of a pixel, and a display device with high reliability are provided. The display device includes a transistor electrically connected to a light-transmitting pixel electrode and a capacitor. The transistor includes a gate electrode, a gate insulating film, and a first multilayer film including an oxide semiconductor layer. The capacitor includes the pixel electrode and a second multilayer film overlapping with the pixel electrode, positioned at a predetermined distance from the pixel electrode, and having the same layer structure as the first multilayer film. A channel formation region of the transistor is at least one layer, which is not in contact with the gate insulating film, of the first multilayer film.

20 Claims, 18 Drawing Sheets

(51) Int. Cl.
*H01L 27/32* (2006.01)
*H01L 29/786* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,122,835 B1 | 10/2006 | Ikeda et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,102,476 B2 | 1/2012 | Son et al. |
| 8,148,779 B2 | 4/2012 | Jeong et al. |
| 8,158,980 B2 * | 4/2012 | Yamazaki et al. .... H01L 27/124 257/59 |
| 8,188,480 B2 | 5/2012 | Itai |
| 8,202,365 B2 | 6/2012 | Umeda et al. |
| 8,203,143 B2 | 6/2012 | Imai |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0236640 A1 | 10/2007 | Kimura |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163874 A1 | 7/2010 | Koyama et al. |
| 2010/0320458 A1 | 12/2010 | Umeda et al. |
| 2010/0320459 A1 | 12/2010 | Umeda et al. |
| 2011/0032435 A1 | 2/2011 | Kimura |
| 2011/0193083 A1 | 8/2011 | Kim et al. |
| 2011/0215328 A1 | 9/2011 | Morosawa et al. |
| 2012/0062811 A1 | 3/2012 | Miyake |
| 2012/0119205 A1 | 5/2012 | Taniguchi et al. |
| 2012/0146043 A1 | 6/2012 | Kitakado |
| 2012/0305925 A1 | 12/2012 | Misaki |
| 2014/0034954 A1 | 2/2014 | Yamazaki et al. |
| 2014/0061654 A1 | 3/2014 | Yamazaki et al. |
| 2014/0070209 A1 | 3/2014 | Yamazaki et al. |
| 2014/0070224 A1 | 3/2014 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-104312 A | 4/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-077822 A | 3/2005 |
| JP | 2007-096055 A | 4/2007 |
| JP | 2007-123861 A | 5/2007 |
| JP | 2009-231613 A | 10/2009 |
| JP | 2010-016347 A | 1/2010 |
| JP | 4415062 | 2/2010 |

(56) References Cited

FOREIGN PATENT DOCUMENTS

| JP | 2010-067954 A | 3/2010 |
|---|---|---|
| JP | 2010-177431 A | 8/2010 |
| JP | 4571221 | 10/2010 |
| JP | 2012-160679 A | 8/2012 |
| WO | WO-2004/114391 | 12/2004 |
| WO | WO-2008/133345 | 11/2008 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied. Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7,8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films byIrradiation with Ultraviolet Lamp", Journal of Sol-Gel Science and Technology, 2003, vol 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFt", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Techncial Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Election Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:AL and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

(56) References Cited

OTHER PUBLICATIONS

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '07 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "Suftla Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N. et al., "Spinel,YBFe2O4, and YB2FE3O7 Types of Structures for Compounds in the In2O3 and SC2O3—A2O3-BO Systems [A; Fe, Ga, or Al; B: Mg, Mn, Fe, Ni, Cu, or Zn]at Temperatures over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 with Sputtered Al2O3 Gate Insulator", Appl.Phys. Lett. (Applied Physics Letters), Sep. 1, 2003, vol. 83, No. 9, pp. 1755-1757.

\* cited by examiner

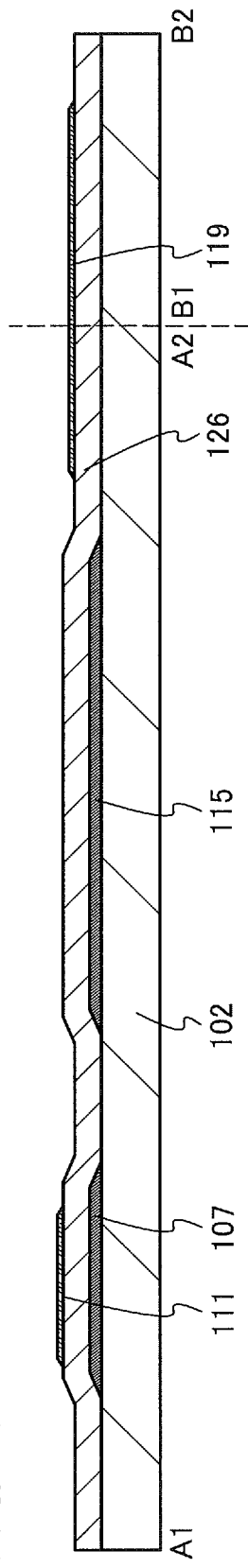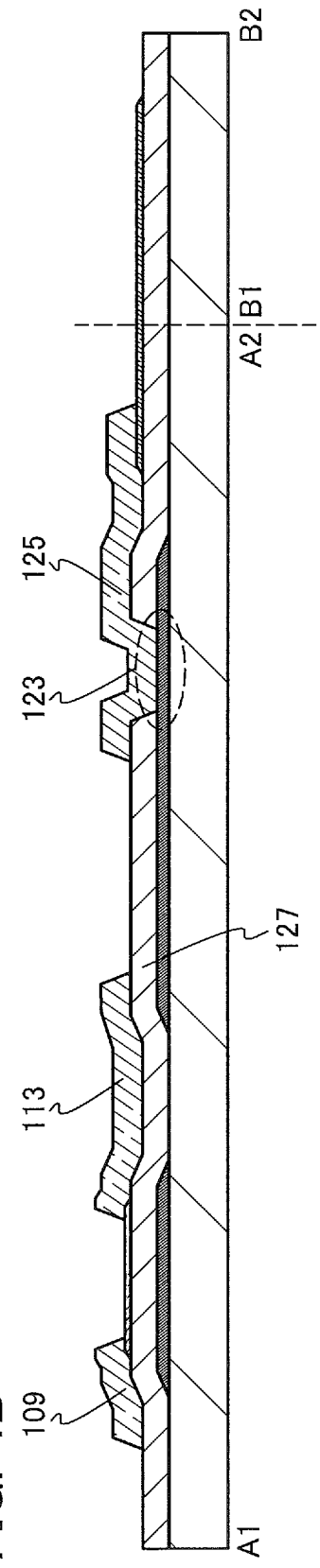

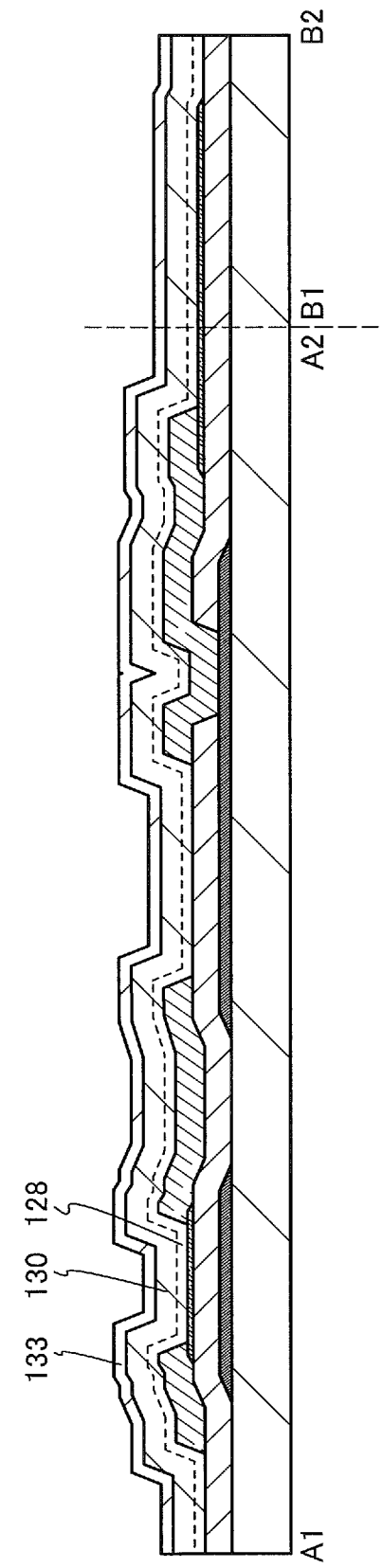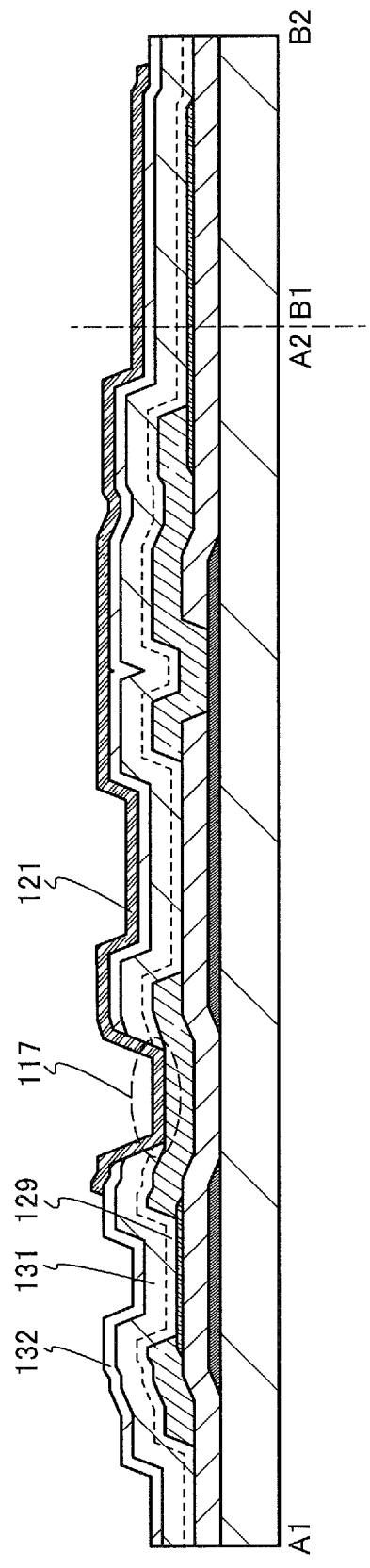

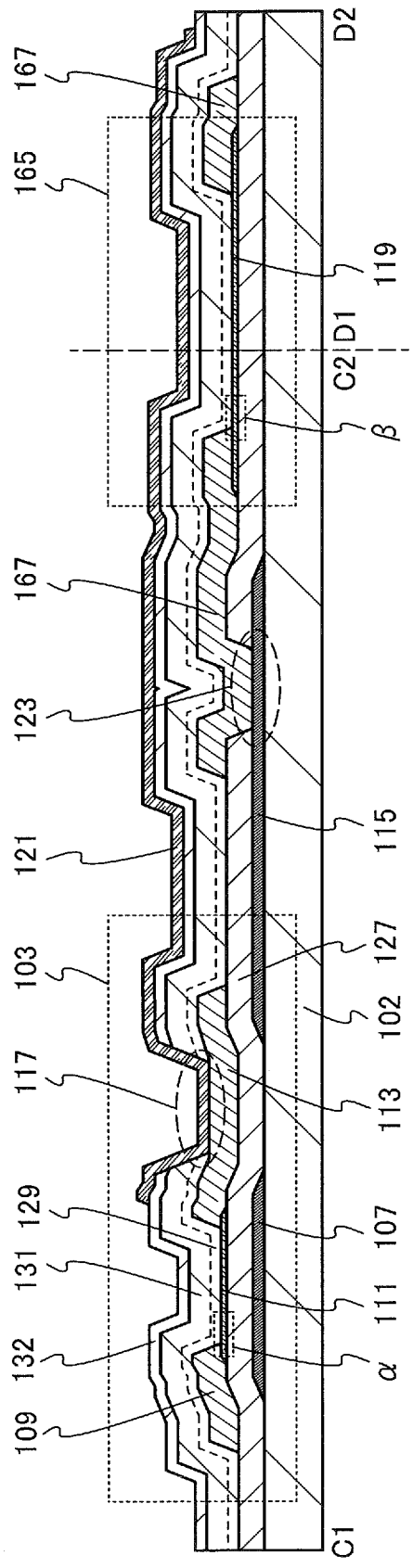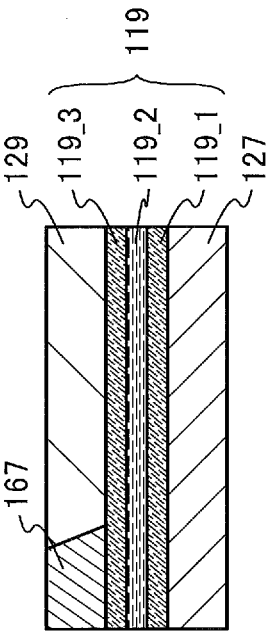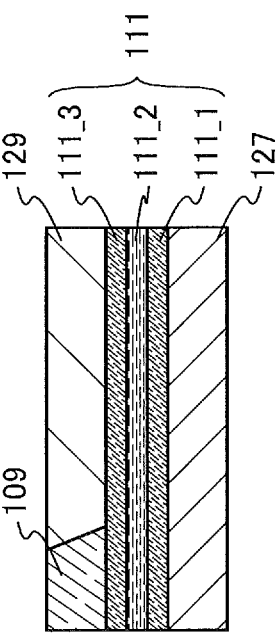

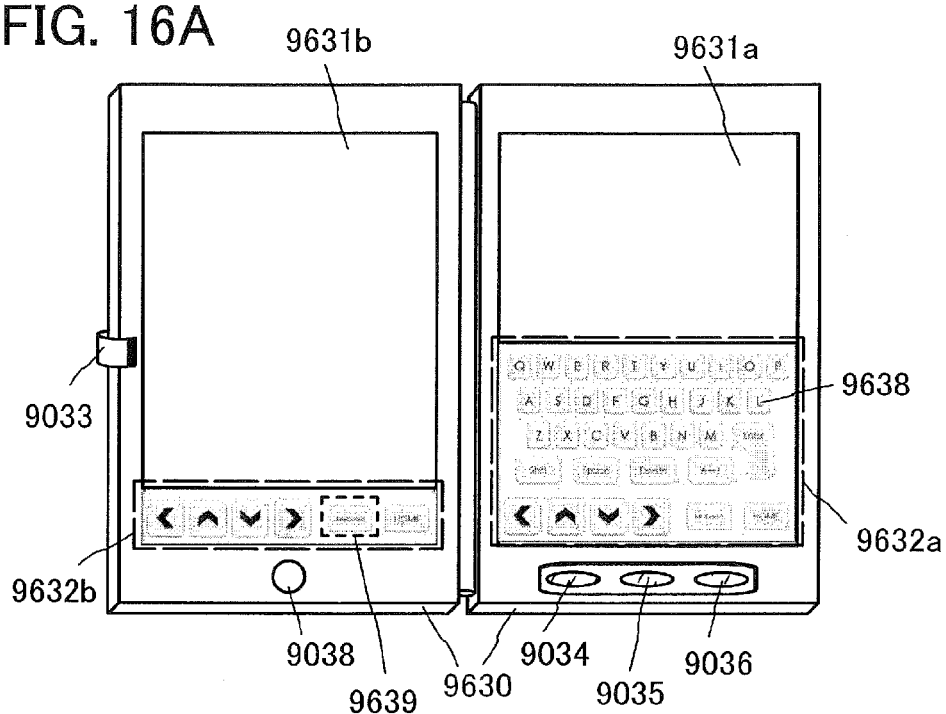
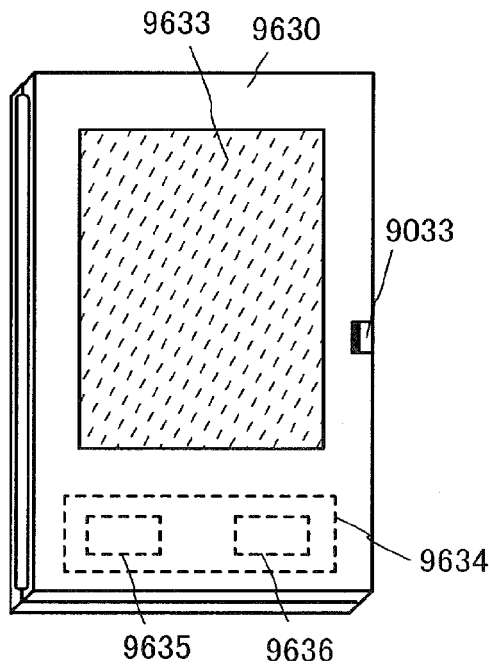
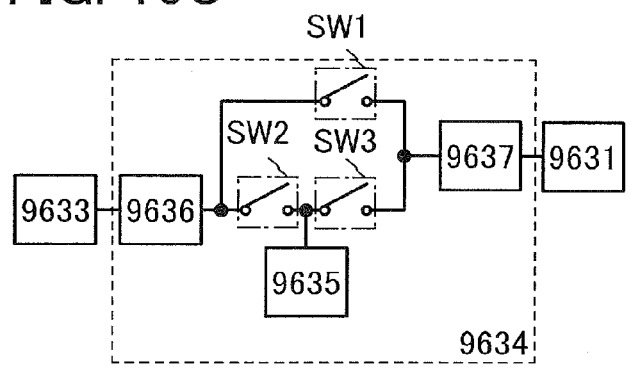

DISPLAY DEVICE AND ELECTRONIC APPLIANCE

BACKGROUND OF THE INVENTION

1. Field of the Invention

The invention disclosed in this specification and the like relates to a display device and an electronic appliance.

2. Description of the Related Art

In recent years, flat panel displays such as liquid crystal displays and organic EL displays have been widely used. In each of pixels provided in the row direction and the column direction in a display device such as a flat panel display, a transistor serving as a switching element, a display element electrically connected to the transistor, and a capacitor connected to the display element are provided.

As a silicon semiconductor film which is used for a transistor, either an amorphous silicon film or a polycrystalline silicon film is used depending on the purpose. For example, in the case where a display device is manufactured over a large substrate, a transistor using an amorphous silicon film, which can be formed using the established technique for forming a film over a large substrate, is preferable. Manufacturing the display device over the large substrate can reduce manufacturing costs of the display device. However, since a transistor using the amorphous silicon film has low field-effect mobility, the area of the transistor needs to be increased for sufficient on-state current. The aperture ratio of a pixel decreases as the area of the transistor increases, which results in an increase in power consumption of the display device.

In contrast, a transistor using a polycrystalline silicon film has high field-effect mobility; thus, sufficient on-state current can be obtained even when the transistor has a small area. Thus, the aperture ratio of a pixel can be increased, which results in a reduction in power consumption of a display device. However, the polycrystalline silicon film is formed by performing high-temperature heat treatment or laser light treatment on an amorphous silicon film, and thus is difficult to be formed over a large substrate. Since the display device is difficult to be manufactured over the large substrate, manufacturing costs of the display device is increased.

Oxides having semiconductor characteristics (also referred to as oxide semiconductors) are semiconductor materials that can be used for semiconductor films in transistors. For example, a technique by which a transistor is manufactured using zinc oxide or an In—Ga—Zn-based oxide is disclosed (see Patent Documents 1 and 2).

An oxide semiconductor film can be formed by a sputtering method, and thus is suitable for manufacturing a display device over a large substrate. Manufacturing the display device over the large substrate can reduce the manufacturing costs of the display device. A transistor using the oxide semiconductor film has high field-effect mobility; thus, sufficient on-state current can be obtained even when the transistor has a small area. Thus, the aperture ratio of a pixel can be increased, which results in a reduction in the power consumption of the display device. In addition, there is an advantage that capital investment can be reduced because part of production equipment for a transistor including an amorphous silicon film can be retrofitted and utilized.

As the resolution of the display device increases, the area occupied by a wiring, an electrode, and the like increases; thus, the aperture ratio of a pixel is reduced, which results in an increase in the power consumption of the display device. For example, in the case where the width of a wiring is reduced in order to increase the aperture ratio of a pixel, the operation of the display device is delayed, which results in deterioration of the display quality of the display device in some cases. Also in the case where the size of a capacitor is reduced in order to increase the aperture ratio of a pixel, deterioration of the display quality of the display device is caused in some cases.

An oxide semiconductor film is known to transmit visible light because of its energy gap as wide as approximately 3 eV to 4 eV. Patent Document 3 discloses that in a display device, a channel layer of a transistor and one capacitor electrode used for a capacitor are formed on the same surface as a light-transmitting oxide semiconductor film. The other capacitor electrode used for the capacitor is formed of a light-transmitting pixel electrode; thus, the capacitor as a whole can be transparent.

[Patent Document 1] Japanese Published Patent Application No. 2007-123861

[Patent Document 2] Japanese Published Patent Application No. 2007-96055

[Patent Document 3] U.S. Pat. No. 8,102,476

SUMMARY OF THE INVENTION

An object is to provide a display device with low manufacturing costs. Another object is to provide a display device with low power consumption. Another object is to provide a display device which can be manufactured over a large substrate. Another object is to provide a display device with a high aperture ratio of a pixel. Another object is to provide a display device with high reliability.

One embodiment of the present invention is a display device which includes a transistor electrically connected to a light-transmitting pixel electrode and a capacitor. The transistor includes a gate electrode, a gate insulating film over the gate electrode, and a first multilayer film including an oxide semiconductor layer which is over the gate insulating film. The capacitor includes a pixel electrode and a second multilayer film which overlaps with the pixel electrode, is positioned at a predetermined distance from the pixel electrode, and has the same layer structure as the first multilayer film. A channel formation region of the transistor is at least one layer, which is not in contact with the gate insulating film, of the first multilayer film.

In order to provide stable electrical characteristics for a transistor whose channel is formed in a multilayer film including an oxide semiconductor layer, it is effective to reduce the concentration of impurities in a layer in which a channel is formed in some cases. For example, in some cases, silicon in an oxide semiconductor forms impurity states. Further, in some cases, the impurity states serve as traps to deteriorate the electrical characteristics of the transistor. Note that since an insulating film containing silicon, such as a silicon oxide film, a silicon oxynitride film, a silicon nitride film, or a silicon nitride oxide film is used for the gate insulating film of the transistor in many cases, it is preferable that a layer, in which the channel is formed, of the multilayer film including the oxide semiconductor layer be not in contact with the gate insulating film.

In the case where a channel is formed at an interface between the gate insulating film and the multilayer film including the oxide semiconductor layer, interface scattering occurs at the interface and the field-effect mobility of the transistor is decreased. In view of the above, the channel of the transistor is preferably formed in a layer, which is not in contact with the gate insulating film, of the multilayer film including the oxide semiconductor layer.

Accordingly, the channel of the transistor is formed in the layer, which is not in contact with the gate insulating film, of the multilayer film including the oxide semiconductor layer, whereby the transistor can have stable electrical characteristics and high field-effect mobility. When the transistor is used as a switching element of a display device, the display device can have high reliability because the transistor has the stable electrical characteristics. Further, since the transistor can obtain sufficient on-state current even when it has a small area, the aperture ratio of a pixel can be increased, which results in a reduction in the power consumption of the display device.

For example, the multilayer film including the oxide semiconductor layer preferably has the structure described below in order that the channel formation region of the transistor is located away from the gate insulating film.

The multilayer film including the oxide semiconductor layer includes at least an oxide semiconductor layer (referred to as second oxide layer for convenience) and a first oxide layer between the second oxide layer and the gate insulating film. The first oxide layer is an oxide film which is formed of one or more kinds of elements other than oxygen, which form the second oxide layer and has electron affinity which is lower than that of the second oxide layer by 0.2 eV or more. At this time, when an electric field is applied to the gate electrode, a channel is formed in the second oxide layer having a higher electron affinity in the multilayer film including the oxide semiconductor layer. In other words, forming the first oxide layer between the second oxide layer and the gate insulating film enables the channel of the transistor to be formed in the layer (here, the second oxide layer) which is not in contact with the gate insulating film. Further, since the first oxide layer is formed of one or more kinds of elements other than oxygen, which form the second oxide layer, interface scattering is less likely to occur at an interface between the first oxide layer and the second oxide layer. Thus, carriers are not inhibited from moving at the interface, which results in an increase in the field-effect mobility of the transistor.

The first oxide layer may be, for example, an oxide film containing aluminum, silicon, titanium, gallium, germanium, yttrium, zirconium, tin, lanthanum, cerium, or hafnium at a concentration higher than that in the second oxide layer. Specifically, as the first oxide layer, an oxide film containing the above element at a concentration 1.5 times or more, preferably twice or more, more preferably 3 times or more that in the second oxide layer is used. The above element is strongly bonded to oxygen, and thus has a function of suppressing generation of oxygen vacancies in the oxide film. In other words, the first oxide layer is an oxide film in which oxygen vacancies are less likely to be generated than in the second oxide layer.

Alternatively, in the case where the second oxide layer is an In—Ga—Zn-based oxide having an atomic ratio of In:Ga:Zn=$x_2$:$y_2$:$z_2$ and the first oxide layer is also an In—Ga—Zn-based oxide having an atomic ratio of In:Ga:Zn=$x_1$:$y_1$:$z_1$, the first oxide layer and the second oxide layer which satisfy the following conditions are selected: $y_1/x_1$ is larger than $y_2/x_2$, preferably $y_1/x_1$ is 1.5 times or more as large as $y_2/x_2$, more preferably $y_1/x_1$ is twice or more as large as $y_2/x_2$, further preferably $y_1/x_1$ is 3 times or more as large as $y_2/x_2$.

The multilayer film including the oxide semiconductor layer may include a third oxide layer on the side which is not in contact with the gate insulating film, which is in contact with the second oxide layer, is formed of one or more kinds of elements other than oxygen, which form the second oxide layer, and has a lower electron affinity than the second oxide layer by 0.2 eV or more. At this time, a channel is not formed in the third oxide layer even when an electric field is applied to the gate electrode. Further, since the third oxide layer is formed of one or more kinds of elements other than oxygen, which form the second oxide layer, an interface state is less likely to be formed at an interface between the second oxide layer and the third oxide layer. When the interface has an interface state, a second transistor in which the interface serves as a channel formation region and which has different threshold voltage is formed and the apparent threshold voltage of the transistor varies in some cases. Thus, providing the third oxide layer makes it possible to reduce variation in the electrical characteristics of the transistor, such as threshold voltage.

The third oxide layer may be, for example, an oxide film containing aluminum, silicon, titanium, gallium, germanium, yttrium, zirconium, tin, lanthanum, cerium, or hafnium at a concentration higher than that in the second oxide layer. Specifically, as the third oxide layer, an oxide film containing the above element at a concentration 1.5 times or more, preferably twice or more, more preferably 3 times or more that in the second oxide layer is used. The above element is strongly bonded to oxygen, and thus has a function of suppressing generation of oxygen vacancies in the oxide film. In other words, the third oxide layer is an oxide film in which oxygen vacancies are less likely to be generated than in the second oxide layer.

Alternatively, in the case where the second oxide layer is an In—Ga—Zn-based oxide film having an atomic ratio of In:Ga:Zn=$x_2$:$y_2$:$z_2$ and the third oxide layer is also an In—Ga—Zn-based oxide film having an atomic ratio of In:Ga:Zn=$x_3$:$y_3$:$z_3$, the second oxide layer and the third oxide layer which satisfy the following conditions are selected: $y_3/x_3$ is larger than $y_2/x_2$, preferably $y_3/x_3$ is 1.5 times or more as large as $y_2/x_2$, more preferably $y_3/x_3$ is twice or more as large as $y_2/x_2$, further preferably $y_3/x_3$ is 3 times or more as large as $y_2/x_2$.

In the display device according to one embodiment of the present invention, the capacitor includes the light-transmitting pixel electrode and the second multilayer film which has the same layer structure as the multilayer film including the oxide semiconductor layer (for convenience, referred to as first multilayer film) and has a light-transmitting property. The second multilayer film has a light-transmitting property, so that the capacitor can have a light-transmitting property. The use of the light-transmitting capacitor enables the aperture ratio of a pixel to be increased, which results in a reduction in the power consumption of the display device.

Note that forming the second multilayer film in the same process as the first multilayer film can reduce manufacturing steps of the display device. The reduction in the manufacturing steps of the display device can result in a reduction in the manufacturing costs of the display device.

The second multilayer film functions as part of the electrode because carriers are induced in the layer formed in the same process as at least the second oxide layer by an electric field applied from the pixel electrode. Further, the layer formed in the same process as the first oxide layer and the layer formed in the same process as the third oxide layer each have a sufficiently high carrier density as compared to an insulating film such as a gate insulating film; thus, these layers also function as part of the electrode.

According to one embodiment of the present invention, the use of the multilayer film including the oxide semiconductor layer for the transistor and the capacitor enables a display device to be manufactured over a large substrate, so that the display device can have low manufacturing costs. In addition, since the multilayer film used for the capacitor has a light-transmitting property, the aperture ratio of a pixel can be increased, so that the display device can have low power consumption. Moreover, since the channel is formed in the layer, which is not in contact with the gate insulating film, of the multilayer film used for the transistor, the transistor can have stable electrical characteristics, so that the display device can have high reliability.

BRIEF DESCRIPTION OF THE DRAWINGS

FIGS. 4A and 4B are cross-sectional views illustrating a method for manufacturing a display device of one embodiment of the present invention.

FIGS. 5A and 5B are cross-sectional views illustrating a method for manufacturing a display device of one embodiment of the present invention.

FIGS. 7A to 7C are cross-sectional views illustrating a display device of one embodiment of the present invention.

FIGS. 16A to 16C illustrate an electronic appliance including a display device of one embodiment of the present invention.

DETAILED DESCRIPTION OF THE INVENTION

Figure 1A:
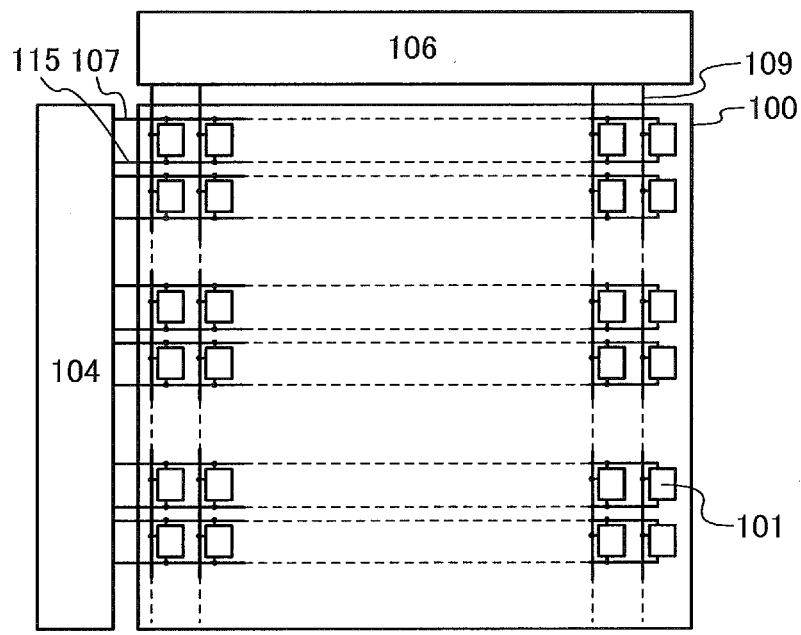
FIG. 1A illustrates a display device of one embodiment of the present invention and FIGS. 1B and 1C are circuit diagrams each illustrating a pixel.

Hereinafter, embodiments of the present invention will be described in detail with reference to the accompanying drawings. However, the present invention is not limited to the description below, and it is easily understood by those skilled in the art that modes and details disclosed herein can be modified in various ways. Therefore, the present invention is not construed as being limited to description of the embodiments below.

In structures of the present invention described below, the same portions or portions having similar functions are denoted by the same reference numerals in different drawings, and description thereof is not repeated. Further, the same hatching pattern is applied to portions having similar functions, and the portions are not especially denoted by reference numerals in some cases.

In each drawing described in this specification, the size, the film thickness, or the region of each component is exaggerated for clarity in some cases. Therefore, embodiments of the present invention are not limited to such scales.

The ordinal numbers such as "first" and "second" in this specification and the like are used for convenience and do not indicate the order of steps or the stacking order of layers. In addition, the ordinal numbers in this specification do not denote particular names which specify the present invention.

Functions of a "source" and a "drain" in the present invention are sometimes replaced with each other when the direction of a current flowing is changed in circuit operation, for example. Therefore, the terms "source" and "drain" can be used to denote the drain and the source, respectively, in this specification.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential or a source potential) is merely called a potential or voltage, and "potential" and "voltage" are used as synonymous words. Thus, in this specification, a potential may be rephrased as a voltage and a voltage may be rephrased as a potential unless otherwise specified.

In this specification, in the case where etching treatment is performed after a photolithography process, a mask formed by the photolithography process is removed.

Embodiment 1

In this embodiment, a display device which is one embodiment of the present invention is described with reference to drawings. Note that in this embodiment, a display device including a liquid crystal element is described as an example.
<Structure of Display Device>

FIG. 1A illustrates an example of a display device. The display device illustrated in FIG. 1A includes a pixel portion 100; a scan line driver circuit 104; a signal line driver circuit 106; m scan lines 107 which are arranged in parallel or almost in parallel to each other and whose potentials are controlled by the scan line driver circuit 104; and n signal lines 109 which are arranged in parallel or almost in parallel to each other and whose potentials are controlled by the signal line driver circuit 106. The pixel portion 100 includes a plurality of pixels 101 arranged in matrix. Capacitor lines 115 which are arranged in parallel or almost in parallel to the scan lines 107 are also provided. The capacitor lines 115 may be arranged in parallel or almost in parallel to the signal lines 109.

Each scan line 107 is electrically connected to the n pixels 101 in the corresponding row among the pixels 101 arranged in m rows and n columns in the pixel portion 100. Each signal line 109 is electrically connected to the m pixels 101 in the corresponding column among the pixels 101 arranged in m rows and n columns. Note that m and n are each an integer of 1 or more. Each capacitor line 115 is electrically connected to the n pixels 101 in the corresponding row among the pixels 101 arranged in m rows and n columns. Note that in the case where the capacitor lines 115 are arranged in parallel or almost in parallel to the signal lines 109, each capacitor line 115 is electrically connected to the m pixels 101 in the corresponding column among the pixels 101 arranged in m rows and n columns.

Figure 1B:
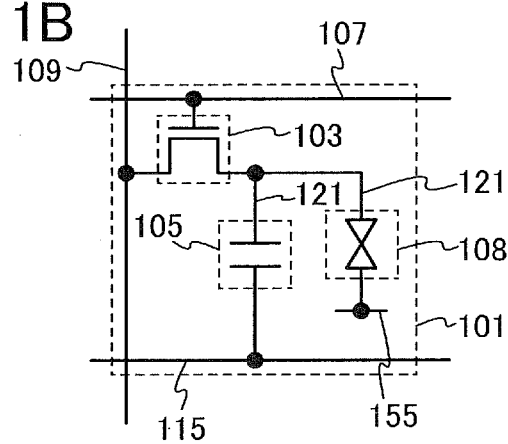

FIG. 1B is an example of a circuit diagram of the pixel 101 included in the display device illustrated in FIG. 1A. The pixel 101 illustrated in FIG. 1B includes a transistor 103, a capacitor 105, and a liquid crystal element 108. The transistor 103 is electrically connected to the scan line 107 and the signal line 109. One electrode of the capacitor 105 is electrically connected to a drain electrode of the transistor 103 and a pixel electrode 121, and the other electrode of the capacitor 105 is electrically connected to the capacitor line 115 which supplies a constant potential. The liquid crystal element 108, in which the pixel electrode 121 is electrically connected to the drain electrode of the transistor 103 and the one electrode of the capacitor 105, is electrically connected to a wiring 155 which supplies a potential to an electrode (counter electrode) facing the pixel electrode 121.

In the capacitor 105, part of the pixel electrode 121 can function as one electrode and the electrode connected to the capacitor line 115 can function as the other electrode. At this time, in the case where the conductivity of the other electrode is high, the capacitor 105 can be illustrated as in the circuit diagram of FIG. 1B. On the other hand, in the case where the conductivity of the other electrode is low, the capacitor 105 can be illustrated as in the circuit diagram of FIG. 1C.

Figure 1C:
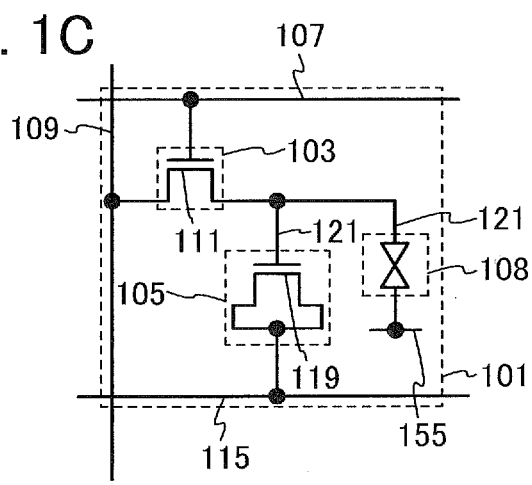

The pixel 101 illustrated in FIG. 1C includes a transistor 103, a capacitor 105, and a liquid crystal element 108. The transistor 103 is electrically connected to the scan line 107 and the signal line 109. One electrode of the capacitor 105 is electrically connected to a drain electrode of the transistor 103 and a pixel electrode 121, and the other electrode of the capacitor 105 is electrically connected to the capacitor line 115 which supplies a constant potential. The liquid crystal element 108, in which the pixel electrode 121 is electrically connected to the drain electrode of the transistor 103 and the one electrode of the capacitor 105, is electrically connected to the wiring 155 which supplies a potential to an electrode (counter electrode) facing the pixel electrode 121.

In the capacitor 105 illustrated in FIG. 1C, a multilayer film 119 has the same layer structure as a multilayer film 111 used for the transistor 103. The multilayer film 119 functions as an electrode when the multilayer film 119 is brought into a conductive state by controlling a potential to be supplied thereto. The multilayer film 119 functions as the other electrode of the capacitor 105. Thus, the capacitor 105 can be said to have a metal oxide semiconductor (MOS) capacitor structure.

Figure 17A:
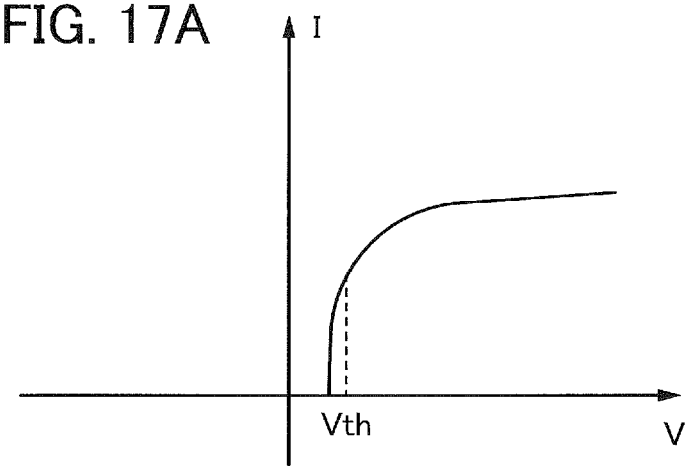
FIGS. 17A to 17C show the relation between current and voltage of a transistor included in a display device and the relation between voltage and capacitance of a capacitor in the display device.

The multilayer film 119 included in the capacitor 105 is formed by utilizing the formation process of the multilayer film 111 included in the transistor 103 which is an enhancement-mode transistor. Thus, the capacitor 105 starts to be charged when a difference between a potential VP of the pixel electrode 121 and a potential VC of the capacitor line 115 (VP−VC) is higher than or equal to 0 V (see FIGS. 17B and 17C). Thus, the threshold voltage (Vth) of the capacitor 105 is higher than or equal to 0 V. FIG. 17A shows an I-V curve of the enhancement-mode transistor 103 and threshold voltage thereof. Note that the vertical axis of FIG. 17A is a logarithmic axis.

Figure 17B:
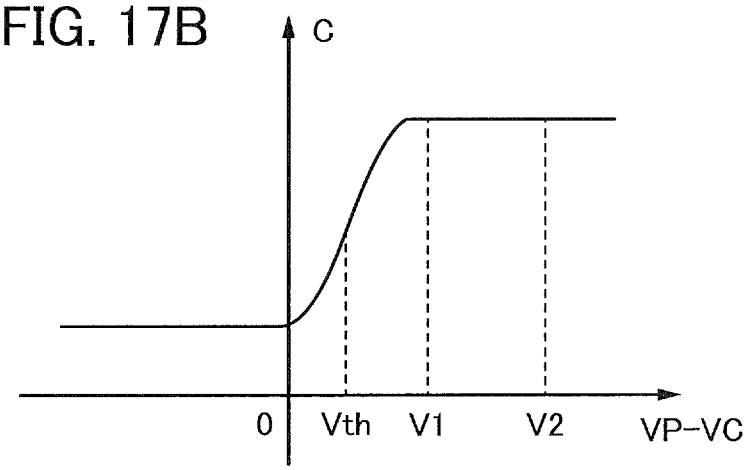
Figure 17C:
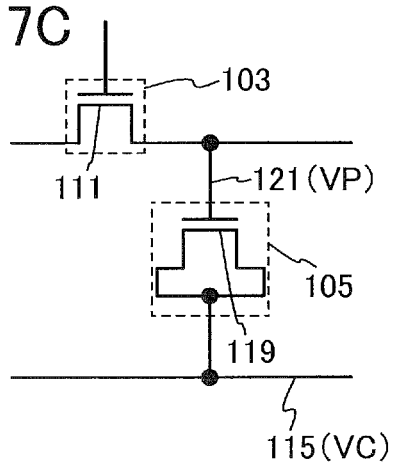

FIG. 17B shows a C-V (capacitance-voltage) curve of the capacitor 105. In FIG. 17B, the horizontal axis represents a potential difference (VP−VC) between the pixel electrode 121 of the capacitor 105 and the capacitor line 115, and the vertical axis represents capacitance C of the capacitor 105. In the case where the frequency of voltage at the time of the C-V measurement is lower than the frame frequency of the display device, a C-V curve as shown in FIG. 17B is obtained.

The multilayer film 119 of the capacitor 105 can be formed by utilizing the formation process of the multilayer film 111 of the transistor 103; thus the multilayer film 119 is an oxide semiconductor film which is not subjected to treatment for intentionally increasing carrier density, treatment for adding an impurity for increasing conductivity, or the like. Thus, the carrier density of the multilayer film 119 is equivalent to that of the multilayer film 111.

The liquid crystal element 108 is an element which controls transmission of light by an optical modulation action of liquid crystal which is sandwiched between a substrate provided with the transistor 103 and the pixel electrode 121 and a substrate provided with the counter electrode. The optical modulation action of a liquid crystal is controlled by an electric field applied to the liquid crystal (including a horizontal electric field, a vertical electric field, and an oblique electric field).

Figure 2:
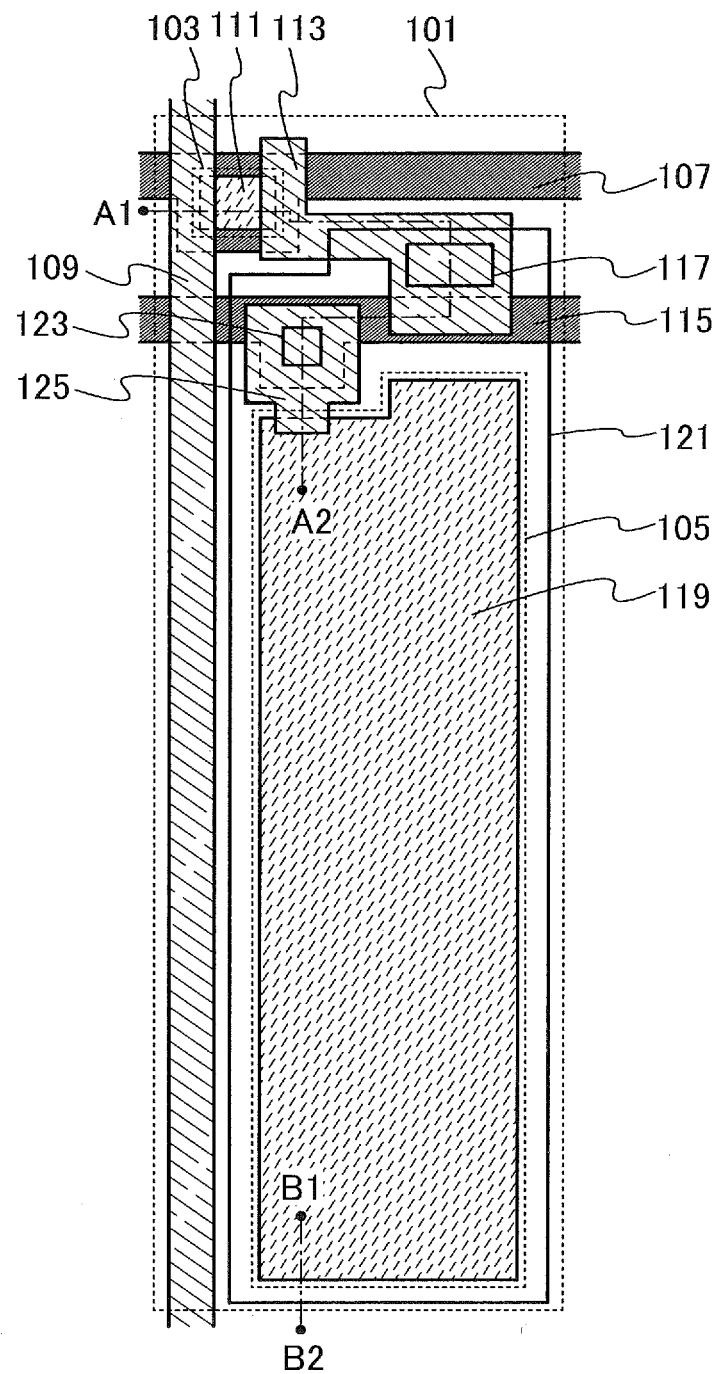
FIG. 2 is a top view illustrating a pixel of a display device of one embodiment of the present invention.

Next, a specific example of the pixel 101 of the liquid crystal display device is described. FIG. 2 is a top view of the pixel 101. Note that in FIG. 2, the counter electrode and the liquid crystal element are omitted.

In FIG. 2, the scan line 107 extends in a direction substantially perpendicular to the signal line 109 (in the horizontal direction in the drawing). The signal line 109 extends in a direction substantially perpendicular to the scan line 107 (in the vertical direction in the drawing). The capacitor line 115 extends in a direction parallel to the scan line 107. Note that the scan line 107 and the capacitor line 115 are electrically connected to the scan line driver circuit 104 (see FIG. 1A), and the signal line 109 is electrically connected to the signal line driver circuit 106 (see FIG. 1A).

The transistor 103 is provided in a region where the scan line 107 and the signal line 109 cross each other. The transistor 103 includes a gate electrode, a gate insulating film (not illustrated in FIG. 2) over the gate electrode, and the multilayer film 111 including an oxide semiconductor layer over the gate insulating film. A region of the scan line 107 which overlaps with the multilayer film 111 functions as the gate electrode of the transistor 103. A region of the scan line 109 which overlaps with the multilayer film 111 functions as a source electrode of the transistor 103. A region of a conductive film 113 which overlaps with the multilayer film 111 functions as the drain electrode of the transistor 103. Thus, the gate electrode, the source electrode, and the drain electrode may be referred to as the scan line 107, the signal line 109, and the conductive film 113, respectively. Further, in FIG. 2, an edge of the scan line 107 is on the outer side of an edge of the multilayer film 111 when seen from above. Thus, the scan line 107 functions as a light-blocking film for blocking light from a backlight. For this reason, the multilayer film 111 including an oxide semiconductor layer which is included in the transistor 103 is not irradiated with light, so that variation in the electrical characteristics of the transistor 103 can be reduced.

Further, when the multilayer film 111 including the oxide semiconductor layer is processed under appropriate conditions, the off-state current of the transistor 103 can be extremely low. This enables the power consumption of the display device to be reduced.

In this embodiment, a structure of the multilayer film 111 including the oxide semiconductor layer which includes a first oxide layer, a second oxide layer which is an oxide semiconductor over and in contact with the first oxide layer, and a third oxide layer over and in contact with the second oxide layer is described.

The conductive film 113 is electrically connected to the light-transmitting pixel electrode 121 through an opening 117. Thus, the light-transmitting pixel electrode 121 is electrically connected to the transistor 103.

The capacitor 105 is provided in a region which is in the pixel 101 and is surrounded by the capacitor lines 115 and the signal lines 109. Note that the capacitor 105 has a light-transmitting property. Thus, the capacitor 105 can be formed large (in a large area) in the pixel 101. This enables the display device to have a higher aperture ratio and higher charge capacity.

For example, in a high-definition display device such as a liquid crystal display device, the area of a pixel is small and accordingly the area of a capacitor is also small. For this reason, the capacity of charge stored in the capacitor 105 is small in the high-definition display device. However, since the capacitor 105 described in this embodiment has a light-transmitting property, when the capacitor 105 is provided in each pixel, enough charge capacity can be obtained in each pixel and the aperture ratio can be improved. Typically, the capacitor 105 can be favorably used for a high-definition display device with a pixel density of 200 pixels per inch (ppi) or more, or furthermore, 300 ppi or more. Further, according to one embodiment of the present invention, the aperture ratio can be improved, which makes it possible to use efficiently light from a light source device such as a backlight, so that the power consumption of the display device can be reduced.

Now, a method for driving the display device of one embodiment of the present invention is described. Since the display device of one embodiment of the present invention includes the capacitor 105 having a MOS capacitor structure, the potential VC is supplied to the multilayer film 119 functioning as the other electrode of the capacitor 105 (i.e., the capacitor line 115) as described below so that the capacitor 105 is stably operated.

As described above, the C-V curve of the capacitor 105 is a C-V curve showing a threshold voltage higher than or equal to 0 V as shown in FIG. 17B. The capacitor 105 is stably operated in an operation period of the capacitor 105 means that the capacitor 105 is sufficiently charged. It means that, for example, the potential VC is supplied so that the difference between the potential VP of the pixel electrode 121 of the capacitor 105 and the potential VC of the multilayer film 119 (VP−VC) in the operation period of the capacitor 105 is higher than or equal to V1 and lower than or equal to V2 in FIG. 17B.

Figure 18:
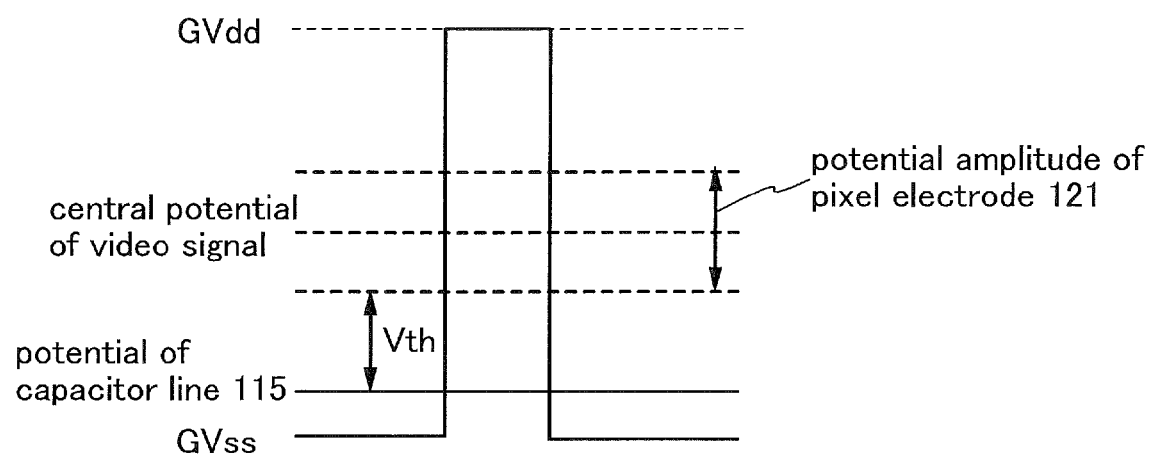
FIG. 18 shows a method for operating a capacitor included in a display device.

In the operation period of the capacitor 105, the potential VP of the pixel electrode 121 shifts in the positive direction and the negative direction depending on a signal input to the signal line 109. Specifically, the potential VP shifts in the positive direction and the negative direction relative to the central potential of a video signal. Thus, in order that the potential difference between the pixel electrode 121 and the multilayer film 119 is set to V1 and V2 in the operation period of the capacitor 105, the potential of the multilayer film 119 may be a potential lower than each of V1 and V2 by the threshold voltage of the capacitor 105 or more (see FIG. 18). Note that in FIG. 18, the lowest potential of the potentials supplied to the scan line 107 is GVss and the highest potential thereof is GVdd.

In other words, in order to operate the capacitor 105, the potential difference between the pixel electrode 121 and the multilayer film 119 is preferably higher than the threshold voltage of the capacitor 105 in the operation period of the capacitor 105.

Further, the multilayer film 119 of the capacitor 105 has the same structure as the multilayer film 111 of the transistor 103; thus, the threshold voltage of the capacitor 105 is equivalent to that of the transistor 103. Accordingly, the potential VC of the multilayer film 119 is preferably set to a potential which is lower than or equal to a potential obtained by subtracting the threshold voltage of the transistor 103 from the potential VP of the pixel electrode 121. In this manner, in an operation period of the capacitor 105, the multilayer film 119 can be constantly in a conductive state, so that the capacitor 105 can be operated stably.

As described above, by using a driving method which is one embodiment of the present invention, a display device provided with a capacitor including a light-transmitting semiconductor film, a light-transmitting conductive film, and a light-transmitting insulating film can be operated while the capacitor is stable with time.

Further, the transistor 103 is an enhancement-mode transistor and the capacitor 105 is formed by utilizing a formation process of the transistor 103 which is an enhancement-mode transistor; thus, the voltage range needed for driving the display device which is one embodiment of the present invention is narrower than that needed for driving a display device in which a depletion-mode transistor is used as the transistor 103 and the capacitor 105 is formed using an oxide semiconductor film in which carrier density is increased and which is formed by utilizing a formation process of the depletion-mode transistor. Thus, according to one embodiment of the present invention, power consumption of the display device can be reduced.

Figure 3A:
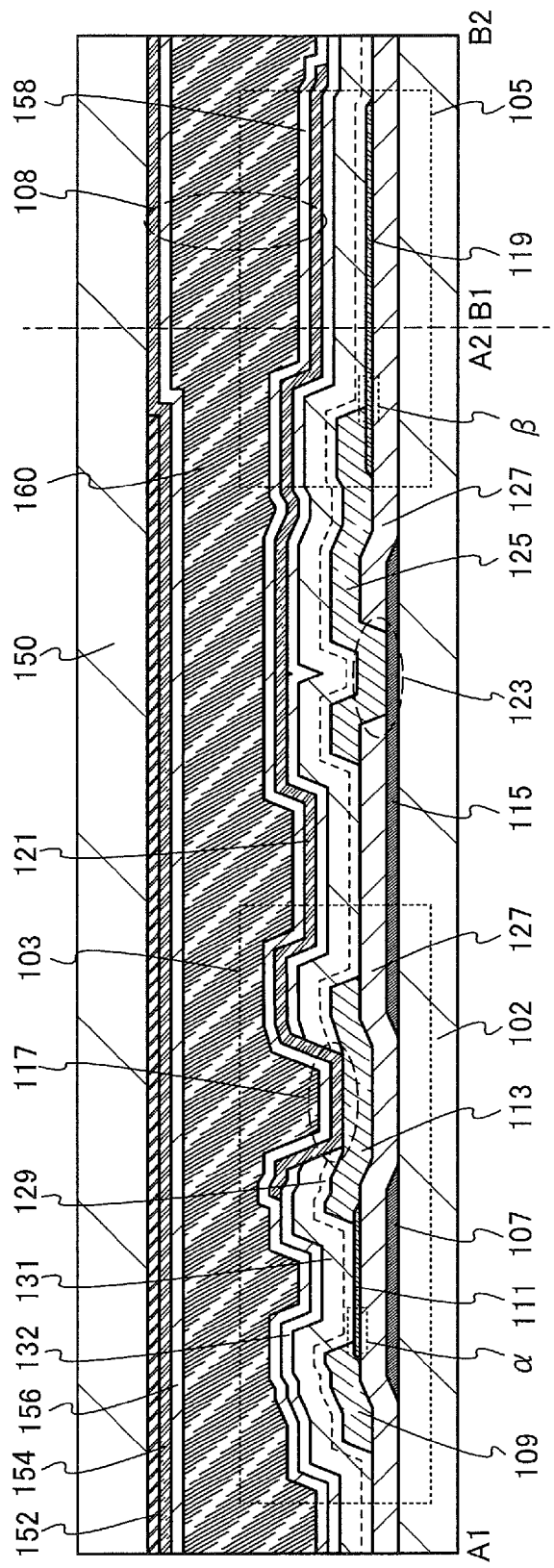
FIGS. 3A to 3C are cross-sectional views illustrating a display device of one embodiment of the present invention.

FIG. 3A is a cross-sectional view taken along the dashed-dotted lines A1-A2 and B1-B2 in FIG. 2.

A cross-sectional structure of the pixel 101 of the liquid crystal display device in FIG. 3A is as described below. The liquid crystal display device includes an element portion over a first substrate 102, an element portion on a second substrate 150, and a liquid crystal layer 160 interposed between the two element portions.

First, a structure of the element portion over the first substrate 102 is described. The scan line 107 part of which functions as the gate electrode of the transistor 103 and the capacitor line 115 over the same surface as the scan line 107 are provided over the first substrate 102. A gate insulating film 127 is provided over the scan line 107 and the capacitor line 115. The multilayer film 111 is provided in a region over the gate insulating film 127 which overlaps with the scan line 107, and the multilayer film 119 is provided over the gate insulating film 127 in a region where the capacitor 105 is formed. The signal line 109 part of which functions as the source electrode of the transistor 103 and the conductive film 113 part of which functions as the drain electrode of the transistor 103 are provided over the gate insulating film 127.

An opening 123 reaching the capacitor line 115 is formed in the gate insulating film 127 on which the capacitor 105 is formed, and the conductive film 125 is provided in the opening 123 and over the gate insulating film 127 and the multilayer film 119.

Further, an insulating film 129, an insulating film 131, and an insulating film 132 which function as protective insulating films of the transistor 103 and dielectrics of the capacitor 105 are provided over the gate insulating film 127, the signal line 109, the multilayer film 111, the conductive film 113, the conductive film 125, and the multilayer film 119. Note that the opening 117 reaching the conductive film 113 is formed in the insulating film 129, the insulating film 131, and the insulating film 132, and the pixel electrode 121 is provided in the opening 117 and over the insulating film 132.

The capacitor 105 has a light-transmitting property and includes the pixel electrode 121, the insulating film 129, the insulating film 131, the insulating film 132, and the multilayer film 119.

An insulating film 158 functioning as an alignment film is provided over the pixel electrode 121 and the insulating film 132. Note that a base insulating film may be provided between the first substrate 102 and the scan line 107, the capacitor line 115, and the gate insulating film 127.

Figure 3C:
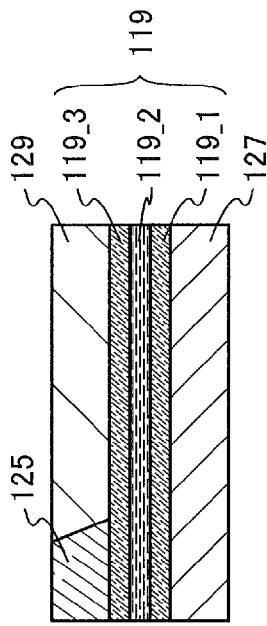
Figure 3B:
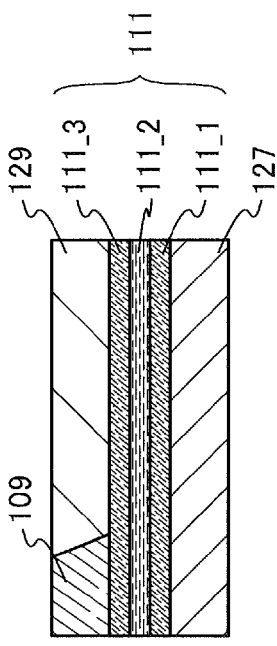

FIG. 3B is an enlarged view of a region α (the gate insulating film 127, the multilayer film 111, the signal line 109, and the insulating film 129) of the display device illustrated in FIG. 3A. FIG. 3C is an enlarged view of a region β (the gate insulating film 127, the multilayer film 119, the conductive film 125, and the insulating film 129) of the display device illustrated in FIG. 3A.

In FIG. 3B, the multilayer film 111 includes a first oxide layer 111_1 in contact with the gate insulating film 127, a second oxide layer 111_2 which is an oxide semiconductor over and in contact with the first oxide layer 111_1, and a third oxide layer 111_3 over and in contact with the second oxide layer 111_2. Note that the signal line 109 and the insulating film 129 are formed over the third oxide layer 111_3. The thickness of the first oxide layer 111_1 is greater than or equal to 1 nm and less than or equal to 50 nm, preferably greater than or equal to 5 nm and less than or equal to 50 nm, more preferably greater than or equal to 10 nm and less than or equal to 40 nm. The thickness of the second oxide layer 111_2 is greater than or equal to 1 nm and less than or equal to 50 nm, preferably greater than or equal to 3 nm and less than or equal to 40 nm, more preferably greater than or equal to 5 nm and less than or equal to 30 nm. The thickness of the third oxide layer 111_3 is greater than or equal to 1 nm and less than or equal to 50 nm, preferably greater than or equal to 3 nm and less than or equal to 40 nm, more preferably greater than or equal to 5 nm and less than or equal to 30 nm.

The first oxide layer 111_1 is an oxide film which is formed of one or more kinds of elements other than oxygen, which form the second oxide layer 111_2 and has a lower electron affinity than the second oxide layer 111_2 by 0.2 eV or more. At this time, when an electric field is applied to the gate electrode, a channel is formed in the second oxide layer 111_2 having a higher electron affinity than the other layers in the multilayer film 111 including the oxide semiconductor layer. In other words, the first oxide layer 111_1 is provided between the second oxide layer 111_2 and the gate insulating film 127, so that the channel of the transistor 103 can be formed in a layer (here, the second oxide layer 111_2) which is not in contact with the gate insulating film 127.

The first oxide layer 111_1 may be, for example, an oxide film containing aluminum, silicon, titanium, gallium, germanium, yttrium, zirconium, tin, lanthanum, cerium, or hafnium at a concentration higher than that in the second oxide layer 111_2. Specifically, as the first oxide layer 111_1, an oxide film containing the above element at a concentration 1.5 times or more, preferably twice or more, more preferably 3 times or more that in the second oxide layer 111_2 is used. The above element is strongly bonded to oxygen, and thus has a function of suppressing generation of oxygen vacancies in the oxide film. In other words, the first oxide layer 111_1 is an oxide film in which oxygen vacancies are less likely to be generated than in the second oxide layer 111_2.

Alternatively, in the case where the second oxide layer 111_2 is an In—Ga—Zn-based oxide film having an atomic ratio of In:Ga:Zn=$x_2$:$y_2$:$z_2$ and the first oxide layer 111_1 is also an In—Ga—Zn-based oxide film having an atomic ratio of In:Ga:Zn=$x_1$:$y_1$:$z_1$, the first oxide layer 111_1 and the second oxide layer 111_2 which satisfy the following conditions are selected: $y_1/x_1$ is larger than $y_2/x_2$, preferably $y_1/x_1$ is 1.5 times or more as large as $y_2/x_2$, more preferably $y_1/x_1$ is twice or more as large as $y_2/x_2$, further preferably $y_1/x_1$ is three times or more as large as $y_2/x_2$.

The third oxide layer 111_3 is an oxide film which is formed of one or more kinds of elements other than oxygen, which form the second oxide layer 111_2 and has a lower electron affinity than the second oxide layer 111_2 by 0.2 eV or more. At this time, a channel is not formed in the third oxide layer 111_3 even when an electric field is applied to the gate electrode. Further, since the third oxide layer 111_3 is formed of one or more kinds of elements other than oxygen, which form the second oxide layer 111_2, an interface state is less likely to be formed at an interface between the second oxide layer 111_2 and the third oxide layer 111_3. When the interface has an interface state, a second transistor in which the interface serves as a channel formation region is formed and the apparent threshold voltage of the transistor varies in some cases. Thus, providing the third oxide layer 111_3 makes it possible to reduce variation in the electrical characteristics of the transistor, such as threshold voltage.

The third oxide layer 111_3 may be, for example, an oxide film containing aluminum, silicon, titanium, gallium, germanium, yttrium, zirconium, tin, lanthanum, cerium, or hafnium at a concentration higher than that in the second oxide layer 111_2. Specifically, as the third oxide layer 111_3, an oxide film containing the above element at a concentration 1.5 times or more, preferably twice or more, more preferably 3 times or more that in the second oxide layer 111_2 is used. The above element is strongly bonded to oxygen, and thus has a function of suppressing generation of oxygen vacancies in the oxide film. In other words, the third oxide layer 111_3 is an oxide film in which oxygen vacancies are less likely to be generated than in the second oxide layer 111_2.

Alternatively, in the case where the second oxide layer 111_2 is an In—Ga—Zn-based oxide film having an atomic ratio of In:Ga:Zn=$x_2$:$y_2$:$z_2$ and the third oxide layer 111_3 is also an In—Ga—Zn-based oxide film having an atomic ratio of In:Ga:Zn=$x_3$:$y_3$:$z_3$, the second oxide layer 111_2 and the third oxide layer 111_3 which satisfy the following conditions are selected: $y_3/x_3$ is larger than $y_2/x_2$, preferably, $y_3/x_3$ is 1.5 times or more as large as $y_2/x_2$, more preferably $y_3/x_3$ is twice or more as large as $y_2/x_2$, further preferably $y_3/x_3$ is 3 times or more as large as $y_2/x_2$.

Oxide semiconductors with different crystallinity may be applied to the first oxide layer 111_1 to the third oxide layer 111_3. That is, the first oxide layer 111_1 to the third oxide layer 111_3 may each have a structure in which an oxide semiconductor in which a crystal part is not clearly observed, such as an amorphous oxide semiconductor, and an oxide semiconductor having a crystalline structure (a crystalline oxide semiconductor) such as a single-crystal oxide semiconductor, a polycrystalline oxide semiconductor, and a CAAC-OS (Embodiment 4 is referred to for the details) are combined as appropriate. When an oxide semiconductor in which a crystal part is not clearly observed, such as an amorphous oxide semiconductor, is used as any one of the first to third oxide semiconductor layers 111_1 to 111_3, internal stress or external stress of the oxide semiconductor film is relieved, variations in characteristics of a transistor is reduced and a variation in the threshold voltage of the transistor due to a change over time or a reliability test can be reduced.

For example, the first oxide layer 111_1 is preferably an oxide semiconductor in which a crystal part is not clearly observed, such as an amorphous oxide semiconductor. Further, the second oxide layer 111_2 which can be a channel formation region is preferably a crystalline oxide semiconductor. Further, the third oxide layer 111_3 is preferably an oxide semiconductor in which a crystal part is not clearly observed, such as an amorphous oxide semiconductor or a crystalline oxide semiconductor. Such a structure enables the amount of change in the threshold voltage of the transistor due to change over time or a reliability test to be reduced.

In FIG. 3C, the multilayer film 119 includes a first oxide layer 119_1 which is in contact with the gate insulating film 127, a second oxide layer 119_2 which is an oxide semiconductor film over and in contact with the first oxide layer 119_1, and a third oxide layer 119_3 which is over and in contact with the second oxide layer 119_2. Note that the conductive film 125 and the insulating film 129 are formed over the third oxide layer 119_3.

The multilayer film 119 functioning as the other electrode of the capacitor 105 has the same layer structure as the multilayer film 111. In other words, the multilayer film 119 can be formed using an oxide film which can be applied to the multilayer film 111. Further, since the multilayer film 119 can be formed together with the multilayer film 111, the multilayer film 119 contains a metal element of an oxide semiconductor forming the multilayer film 111.

The details of the components of the above-described structure are described below.

Although there is no particular limitation on the material and the like of the first substrate 102, it is necessary that the first substrate 102 have heat resistance high enough to withstand at least heat treatment performed in a manufacturing process of a display device. Examples of the substrate are a glass substrate, a ceramic substrate, and a plastic substrate, and as the glass substrate, an alkali-free glass substrate such as a barium borosilicate glass substrate, an aluminoborosilicate glass substrate, or an aluminosilicate glass substrate is preferably used. Alternatively, a non-light-transmitting substrate such as a stainless alloy substrate may be used. In this case, a surface of the substrate is preferably provided with an insulating film. As the first substrate 102, any of the following substrates may alternatively be used: a quartz substrate, a sapphire substrate, a single crystal semiconductor substrate, a polycrystalline semiconductor substrate, a compound semiconductor substrate, and a silicon on insulator (SOI) substrate.

The scan line 107 and the capacitor line 115, through which a large amount of current flows, are preferably formed using a metal film; typically, they are formed to have a single-layer structure or a stacked-layer structure using any of metal materials such as molybdenum (Mo), titanium (Ti), tungsten (W), tantalum (Ta), aluminum (Al), copper (Cu), chromium (Cr), neodymium (Nd), or scandium (Sc), or an alloy material which contains any of these materials as its main component.

Examples of the scan line 107 and the capacitor line 115 are a single-layer structure using aluminum containing silicon, a two-layer structure in which titanium is stacked over aluminum, a two-layer structure in which titanium is stacked over titanium nitride, a two-layer structure in which tungsten is stacked over titanium nitride, a two-layer structure in which tungsten is stacked over tantalum nitride, a two-layer structure in which copper is stacked over Cu—Mg—Al alloy, and a three-layer structure in which titanium nitride, copper, and tungsten are stacked in this order.

As a material of the scan line 107 and the capacitor line 115, any of the light-transmitting conductive materials described later, which can be used for the pixel electrode 121, can be used.

Alternatively, as a material of the scan line 107 and the capacitor line 115, a metal oxide containing nitrogen, specifically, an In—Ga—Zn-based oxide containing nitrogen, an In—Sn-based oxide containing nitrogen, an In—Ga-based oxide containing nitrogen, an In—Zn-based oxide containing nitrogen, a Sn-based oxide containing nitrogen, an In-based oxide containing nitrogen, or a metal nitride (e.g., InN or SnN) can be used. These materials each have a work function of 5 eV or higher. The use of the metal oxide containing nitrogen for the scan line 107 (the gate electrode of the transistor 103) allows the threshold voltage of the transistor 103 to shift in the positive direction, that is, an enhancement-mode transistor is easily achieved. For example, in the case where an In—Ga—Zn-based oxide containing nitrogen is used, an In—Ga—Zn-based oxide having a higher nitrogen concentration than at least the multilayer film 111 including the oxide semiconductor layer; specifically an In—Ga—Zn-based oxide having a nitrogen concentration of 7 at. % or higher can be used.

The scan line 107 and the capacitor line 115 are preferably formed using aluminum or copper, which are low resistance materials. With the use of aluminum or copper, signal delay can be reduced, so that the image quality of the display device can be improved. Note that aluminum has low heat resistance, and thus a defect due to hillocks, whiskers, or migration is easily generated. In order to prevent a defect due to migration of aluminum, a layer of a metal material having a higher melting point than aluminum, such as molybdenum, titanium, or tungsten, is preferably stacked over an aluminum layer. Also in the case where copper is used, in order to prevent a defect due to migration and the like and diffusion of copper elements, a layer of a metal material having a higher melting point than copper, such as molybdenum, titanium, or tungsten, is preferably stacked over a copper layer.

The gate insulating film 127 is formed to have a single-layer structure or a stacked-layer structure using, for example, one or more of insulating materials such as silicon oxide, silicon oxynitride, silicon nitride oxide, silicon nitride, aluminum oxide, gallium oxide, and a Ga—Zn-based oxide.

Further, it is possible to prevent outward diffusion of oxygen from the multilayer film 111 including the oxide semiconductor layer and entry of hydrogen, water, or the like into the multilayer film 111 including the oxide semiconductor layer from the outside by providing an insulating film having a bather property against oxygen, hydrogen, water, and the like for the gate insulating film 127. Examples of the insulating film having a barrier property against oxygen, hydrogen, water, and the like are an aluminum oxide film, an aluminum oxynitride film, a gallium oxide film, a gallium oxynitride film, an yttrium oxide film, an yttrium oxynitride film, and a silicon nitride film.

The gate insulating film 127 preferably has the stacked-layer structure described below. It is preferable that a silicon nitride film having fewer defects be provided as a first silicon nitride film, a silicon nitride film from which less hydrogen and ammonia are released be provided as a second silicon nitride film over the first silicon nitride film, and any of the oxide insulating films listed as those used for the gate insulating film 127 be provided over the second silicon nitride film.

As the second silicon nitride film, a nitride insulating film in which the number of released hydrogen molecules is preferably less than $5\times10^{21}$ molecules/cm$^3$, more preferably less than or equal to $3\times10^{21}$ molecules/cm$^3$, further preferably less than or equal to $1\times10^{21}$ molecules/cm$^3$, and the number of released ammonia molecules is preferably less than $1\times10^{22}$ molecules/cm$^3$, more preferably less than or equal to $5\times10^{21}$ molecules/cm$^3$, further preferably less than or equal to $1\times10^{21}$ molecules/cm$^3$ when measured by thermal desorption spectroscopy is preferably used. The first silicon nitride film and the second silicon nitride film are used as part of the gate insulating film 127, so that a gate insulating film with a small number of defects and small amounts of released hydrogen and released ammonia can be formed as the gate insulating film 127. Thus, the amount of hydrogen and nitrogen contained in the gate insulating film 127 which enter the multilayer film 111 including the oxide semiconductor layer can be reduced.

The thickness of the gate insulating film 127 is greater than or equal to 5 nm and less than or equal to 400 nm, preferably greater than or equal to 10 nm and less than or equal to 300 nm, more preferably greater than or equal to 50 nm and less than or equal to 250 nm.

The multilayer film 111 and the multilayer film 119 each including the oxide semiconductor layer can have an amorphous structure, a single-crystal structure, or a polycrystalline structure. The thicknesses of the multilayer film 111 and the multilayer film 119 each including the oxide semiconductor layer are greater than or equal to 1 nm and less than or equal to 100 nm, preferably greater than or equal to 1 nm and less than or equal to 50 nm, more preferably greater than or equal to 3 nm and less than or equal to 40 nm, further preferably greater than or equal to 5 nm and less than or equal to 30 nm.

An oxide semiconductor which can be used for the multilayer film 111 including the oxide semiconductor layer and the multilayer film 119 including the oxide semiconductor layer has an energy gap greater than or equal to 2.5 eV, preferably greater than or equal to 2.7 eV, more preferably greater than or equal to 3 eV. The use of such an oxide semiconductor having a wide energy gap can reduce the off-state current of the transistor 103.

For the multilayer film 111 including the oxide semiconductor layer and the multilayer film 119 including the oxide semiconductor layer, for example, any of the following can be used: an indium oxide; a tin oxide; a zinc oxide; an oxide containing two kinds of metals, such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; an oxide containing three kinds of metals, such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, or an In—Hf—Zn-based oxide; and an oxide containing four kinds of oxides, such as an In—Sn—Ga—Zn-based oxide, an In—Al—Ga—Zn-based oxide, or an In—Sn—Al—Zn-based oxide.

Here, an "In—Ga—Zn-based oxide" means an oxide containing In, Ga, and Zn as its main components and there is no particular limitation on the atomic ratio of In:Ga:Zn.

Alternatively, a material represented by $InMO_3(ZnO)_m$ (m>0) may be used as an oxide semiconductor. Note that M represents one or more metal elements selected from Ga, Fe, Mn, and Co.

For example, an In—Ga—Zn-based oxide with an atomic ratio of In:Ga:Zn=1:1:1, 2:2:1, or 3:1:2 can be used. Alternatively, an In—Sn—Zn-based oxide with an atomic ratio of In:Sn:Zn=1:1:1, 2:1:3, or 2:1:5 can be used. Note that the proportion of each atom in the atomic ratio of the metal oxide varies within a range of ±20% as an error.

Here, the characteristics of a transistor including an oxide semiconductor are described. Note that the transistor including an oxide semiconductor used in one embodiment of the present invention is an n-channel transistor. Oxygen vacancies in an oxide semiconductor might generate carriers, which might lower the electrical characteristics and reliability of the transistor. For example, in some cases, the threshold voltage of the transistor shifts in the negative direction, and drain current flows when the gate voltage is 0 V.

In view of the above, it is preferable that defects, typically oxygen vacancies, in the multilayer film 111 including the oxide semiconductor layer be reduced as much as possible. For example, it is preferable that the spin density of the oxide semiconductor film (the density of defects in the oxide semiconductor film) at a g-value higher than or equal to 1.89 and lower than or equal to 1.96 (typically, 1.93) in electron spin resonance spectroscopy in which a magnetic field is applied in parallel to the film surface be reduced to lower than or equal to the lower detection limit of measurement equipment. When the defects, typically oxygen vacancies, in the oxide semiconductor film are reduced as much as possible, the transistor 103 can be prevented from being a depletion-mode transistor, leading to improvements in the electrical characteristics and reliability of the display device.

The shift of the threshold voltage of a transistor in the negative direction is caused in some cases by hydrogen (including a hydrogen compound such as water) contained in an oxide semiconductor as well as by oxygen vacancies. Hydrogen contained in the oxide semiconductor is reacted with oxygen bonded to a metal atom to be water, and in addition, vacancies (also referred to as oxygen vacancies) are formed in a lattice from which oxygen is released (or a portion from which oxygen is removed). In addition, when part of hydrogen reacts with oxygen, electrons serving as carriers are generated. Thus, a transistor including an oxide semiconductor which contains hydrogen is likely to be a depletion-mode transistor.

In view of the above, it is preferable that hydrogen in the multilayer film 111 including the oxide semiconductor layer be reduced as much as possible. Specifically, in the multilayer film 111 including the oxide semiconductor layer, the concentration of hydrogen which is measured by secondary ion mass spectrometry (SIMS) is set to lower than $5\times10^{18}$ atoms/cm$^3$, preferably lower than or equal to $1\times10^{18}$ atoms/cm$^3$, more preferably lower than or equal to $5\times10^{17}$ atoms/cm$^3$, still more preferably lower than or equal to $1\times10^{16}$ atoms/cm$^3$.

Further, in the multilayer film 111 including the oxide semiconductor layer, the concentration of alkali metals or alkaline earth metals which is measured by SIMS is set to lower than or equal to $1\times10^{18}$ atoms/cm$^3$, preferably lower than or equal to $2\times10^{16}$ atoms/cm$^3$. This is because an alkali metal and an alkaline earth metal might generate carriers when bonded to an oxide semiconductor, in which case the off-state current of the transistor 103 might be increased.

Further, when nitrogen is contained in the multilayer film 111 including the oxide semiconductor layer, electrons serving as carriers are generated to increase the carrier density, so that the multilayer film 111 easily becomes n-type. Thus, a transistor including an oxide semiconductor which contains nitrogen is likely to be a depletion-mode transistor. For this reason, nitrogen in the multilayer film 111 including the oxide semiconductor layer is preferably reduced as much as possible; the concentration of nitrogen is preferably set to, for example, lower than or equal to $5\times10^{18}$ atoms/cm$^3$.

In this manner, when the multilayer film 111 including the oxide semiconductor layer which is highly purified by reducing impurities (e.g., hydrogen, nitrogen, an alkali metal, and an alkaline earth metal) as much as possible is used, the transistor 103 can be prevented from being a depletion-mode transistor, so that the off-state current of the transistor 103 can be significantly reduced. Thus, a display device having favorable electrical characteristics can be manufactured. Further, a display device with improved reliability can be manufactured.

Various experiments can prove low off-state current of a transistor including a highly-purified oxide semiconductor film. For example, even when an element has a channel width of $1\times10^6$ µm and a channel length (L) of 10 µm, the off-state current can be lower than or equal to the measurement limit of a semiconductor parameter analyzer, i.e., less than or equal to $1\times10^{-13}$ A, at a voltage (drain voltage) between a source electrode and a drain electrode of from 1 V to 10 V. In this case, it can be seen that the off-state current corresponding to a value obtained by dividing the off-state current by the channel width of the transistor is 100 zA/µm or lower. In addition, a capacitor and a transistor are connected to each other and the off-state current is measured with a circuit in which charge flowing into or from the capacitor is controlled by the transistor. In the measurement, a highly purified oxide semiconductor film is used for a channel formation region of the transistor, and the off-state current of the transistor is measured from a change in the amount of charge of the capacitor per unit time. As a result, it is found that in the case where the voltage between the source electrode and the drain electrode of the transistor is 3 V, lower off-state current of several tens of yoctoamperes per micrometer (yA/µm) can be obtained. Thus, the transistor including the highly purified oxide semiconductor film has a significantly low off-state current.

The signal line 109 part of which functions as the source electrode of the transistor 103, the conductive film 113 part of which functions as the drain electrode of the transistor 103, and the conductive film 125 electrically connecting the multilayer film 119 of the capacitor 105 to the capacitor line 115 can be formed to have a single-layer structure or a stacked-layer structure using a material which can be used for the scan line 107 and the capacitor line 115.

The insulating films 129, 131, and 132 functioning as the protective insulating films of the transistor 103 and the dielectric films in the capacitor 105 are insulating films each of which is formed using a material which can be used for the gate insulating film 127. It is particularly preferable that the insulating films 129 and 131 be oxide insulating films and the insulating film 132 be a nitride insulating film. Further, the use of a nitride insulating film as the insulating film 132 can suppress entry of impurities such as hydrogen and water into the transistor 103 (particularly the multilayer film 111 including the oxide semiconductor layer) from the outside. Note that the insulating film 129 is not necessarily provided.

Further, an oxide insulating film in which the oxygen content is higher than that in the stoichiometric composition is preferably used as one or both of the insulating film 129 and the insulating film 131. In that case, oxygen can be prevented from being released from the oxide semiconductor layer, and the oxygen contained in an oxygen excess region can be transferred to the oxide semiconductor layer to fill oxygen vacancies. For example, when an oxide insulating film having the feature described below is used, the oxygen vacancies in the oxide semiconductor layer can be filled. The feature of the oxide insulating film is that the number of oxygen molecules released from the oxide insulating film is greater than or equal to $1.0\times10^{18}$ molecules/cm$^3$ when measured by thermal desorption spectroscopy (hereinafter referred to as TDS). Note that an oxide insulating film partly including a region in which the oxygen content is higher than that in the stoichiometric composition (oxygen excess region) may be used as one or both of the insulating film 129 and the insulating film 131. When such an oxygen excess region is present in a region overlapping with at least the multilayer film 111 including the oxide semiconductor layer, oxygen is prevented from being released from the oxide semiconductor layer and the oxygen contained in the oxygen excess region can be transferred to the oxide semiconductor layer to fill oxygen vacancies.

In the case where the insulating film 131 is an oxide insulating film in which the oxygen content is higher than that in the stoichiometric composition, the insulating film 129 is preferably an oxide insulating film through which oxygen penetrates. Oxygen which enters the insulating film 129 from the outside does not completely penetrate through the insulating film 129 to be released and part thereof remains in the insulating film 129. Further, there is oxygen which is contained in the insulating film 129 from the first and is released from the insulating film 129 to the outside. Thus, the insulating film 129 preferably has a high coefficient of diffusion of oxygen.

The thickness of the insulating film 129 can be greater than or equal to 5 nm and less than or equal to 150 nm, preferably greater than or equal to 5 nm and less than or equal to 50 nm, more preferably greater than or equal to 10 nm and less than or equal to 30 nm. The thickness of the insulating film 131 can be greater than or equal to 30 nm and less than or equal to 500 nm, preferably greater than or equal to 150 nm and less than or equal to 400 nm.

In the case where a nitride insulating film is used as the insulating film 132, an insulating film having a barrier property against nitrogen is preferably used as one or both of the insulating film 129 and the insulating film 131. For example, a dense oxide insulating film can have a barrier property against nitrogen. Specifically, an oxide insulating film which can be etched at a rate less than or equal to 10 nm per minute when the temperature is 25° C. and 0.5 wt % of hydrofluoric acid is used is preferably used.

In the case where an oxide insulating film containing nitrogen, such as a silicon oxynitride film or a silicon nitride oxide film, is used as one or both of the insulating film 129 and the insulating film 131, the nitrogen concentration measured by secondary ion mass spectrometry (SIMS) is higher than or equal to the lower limit of measurement by SIMS and lower than $3\times10^{20}$ atoms/cm$^3$, preferably higher than or equal to $1\times10^{18}$ atoms/cm$^3$ and lower than or equal to $1\times10^{20}$ atoms/cm$^3$. In that case, the amount of nitrogen which enters the multilayer film 111 including the oxide semiconductor layer included in the transistor 103 can be reduced and the number of defects in the nitrogen-containing oxide insulating film itself can be reduced.

As the insulating film 132, a nitride insulating film with a low hydrogen content may be provided. The nitride insulating film is as follows, for example: the number of hydrogen molecules released from the nitride insulating film is less than $5.0\times10^{21}$ molecules/cm$^3$, preferably less than $3.0\times10^{21}$ molecules/cm$^3$, more preferably less than $1.0\times10^{21}$ molecules/cm$^3$ when measured by TDS.

The insulating film 132 has a thickness large enough to prevent entry of impurities such as hydrogen and water from the outside. For example, the thickness can become greater than or equal to 50 nm and less than or equal to 200 nm, preferably greater than or equal to 50 nm and less than or equal to 150 nm, and further preferably greater than or equal to 50 nm and less than or equal to 100 nm.

The pixel electrode 121 is formed of a light-transmitting conductive material such as an In—Sn-based oxide, an In—W-based oxide, an In—Zn—W-based oxide, an In—Ti-based oxide, an In—Ti—Sn-based oxide, an In—Zn-based oxide, or an In—Si—Sn-based oxide.

Next, a structure of the element portion on the second substrate 150 is described. The element portion includes a light-blocking film 152, an electrode (a counter electrode 154) which is on the light-blocking film 152 and faces the pixel electrode 121, and an insulating film 156 which is on the counter electrode 154 and functions as an alignment film.

For the second substrate 150, a material similar to that used for the first substrate 102 can be used.

The light-blocking film 152 prevents the transistor 103 from being irradiated with backlight or light from the outside. The light-blocking film 152 can be formed using a material such as a metal or an organic resin including a pigment and may be provided in a region outside the pixel portion 100, such as over the scan line driver circuit 104 and over the signal line driver circuit 106 (see FIGS. 1A to 1C), as well as over the transistor 103 in the pixel 101.

Note that a coloring film (also referred to as color filter) which transmits light with a predetermined wavelength may be provided between the adjacent light-blocking films 152. In addition, an overcoat film may be provided between the counter electrode 154, and the light-blocking film 152 and the coloring film in order to suppress dispersion of impurities from the light-blocking film 152, the coloring film, and the like to the liquid crystal layer 160 side.

The counter electrode 154 is formed using any of the conductive materials having light-transmitting properties which are given as those used for the pixel electrode 121 as appropriate.

The liquid crystal element 108 includes the pixel electrode 121, the counter electrode 154, and a liquid crystal layer 160. The liquid crystal layer 160 is sandwiched between the insulating film 158 which is provided in the element portion over the first substrate 102 and functions as an alignment film and the insulating film 156 which is provided in the element portion on the second substrate 150 and functions as an alignment film. Further, the pixel electrode 121 overlaps with the counter electrode 154 with the liquid crystal layer 160 interposed therebetween.

As described above, according to one embodiment of the present invention, the use of the multilayer film including the oxide semiconductor layer for the transistor 103 and the capacitor 105 allows a display device to be manufactured over a large substrate; thus, the display device can be manufactured at low cost. In addition, since the multilayer film 119 used for the capacitor 105 has a light-transmitting property, the aperture ratio of a pixel can be increased, so that the display device can have low power consumption. Moreover, since a channel is formed in a layer of the multilayer film 111 used for the transistor 103, which is not in contact with the gate insulating film 127, the transistor 103 can have stable electrical characteristics, so that the display device can have high reliability.

Further, in the display device of one embodiment of the present invention, a region of the pixel 101 in which the light-blocking film 152 is provided can be reduced or removed in such a manner that polarization axes of polarizing members (polarizing substrates) are provided in parallel to set the display mode of the display device to a normally-black mode in which the liquid crystal element 108 does not transmit light from a light source device such as a backlight with no voltage applied. As a result, the aperture ratio can be improved even in the case where the size of one pixel is small as in a high-definition display device having a pixel density of 200 ppi or higher, and furthermore 300 ppi or more. Further, the aperture ratio can be further improved by using the light-transmitting capacitor 105.

Embodiment 2

In this embodiment, a method for manufacturing the element portion provided over the first substrate 102 of the display device illustrated in FIGS. 3A to 3C in Embodiment 1 is described with reference to FIGS. 4A and 4B and FIGS. 5A and 5B.

<Method for Manufacturing Display Device>

First, the scan line 107 and the capacitor line 115 are formed over the first substrate 102. An insulating film 126 which is to be processed into the gate insulating film 127 later is formed so as to cover the scan line 107 and the capacitor line 115. The multilayer film 111 is formed over a portion of the insulating film 126 which overlaps with the scan line 107. The multilayer film 119 is formed so as to overlap with a region where the pixel electrode 121 is to be formed later (see FIG. 4A).

The scan line 107 and the capacitor line 115 can be formed in such a manner that a conductive film is formed using any of the materials described in Embodiment 1, a mask is formed over the conductive film, and the conductive film is processed using the mask. The conductive film can be formed by any of a variety of deposition methods such as an evaporation method, a PE-CVD method, a sputtering method, and a spin coating method. Note that there is no particular limitation on the thickness of the conductive film, and the thickness of the conductive film can be determined in consideration of time needed for the formation, desired resistivity, or the like. As the mask, for example, a resist mask formed through a photolithography process can be used. The conductive film can be processed by one of or both dry etching and wet etching.

The insulating film 126 can be formed using a material which can be used for the gate insulating film 127, by any of a variety of deposition methods such as a PE-CVD method and a sputtering method.

The multilayer film 111 and the multilayer film 119 can be formed using any of the materials described in Embodiment 1. Note that the oxide films included in the multilayer film 111 and the multilayer film 119 are preferably formed in succession in a vacuum. By forming the oxide films in succession in a vacuum, entry of impurities into the interface between the oxide films can be suppressed.

The multilayer film 111 and the multilayer film 119 can be formed by a sputtering method, a coating method, a pulsed laser deposition method, a laser ablation method, or the like. Alternatively, when a printing method is employed, the multilayer films 111 and 119 which are separate from each other can be formed directly on the insulating film 126.

In the case where the multilayer films 111 and 119 are formed by a sputtering method, an RF power supply device, an AC power supply device, a DC power supply device, or the like can be used as appropriate as a power supply device for generating plasma. As a sputtering gas, a rare gas (typically argon), an oxygen gas, or a mixed gas of a rare gas and oxygen is used as appropriate. In the case of using the mixed gas of a rare gas and oxygen, the proportion of oxygen is preferably higher than that of a rare gas. Further, a target may be appropriately selected in accordance with the composition of the oxide semiconductor film to be formed.

The multilayer films 111 and 119 can be processed by one or both of dry etching and wet etching. The etching conditions (e.g., an etching gas or an etching solution, etching time, and temperature) are set as appropriate depending on the material so that the multilayer films 111 and 119 can be etched to have a desired shape.

Heat treatment is preferably performed after the multilayer films 111 and 119 are formed so that the multilayer films 111 and 119 are subjected to dehydrogenation or dehydration. The temperature of the heat treatment is typically higher than or equal to 150° C. and lower than the strain point of the substrate, preferably higher than or equal to 200° C. and lower than or equal to 450° C., further preferably higher than or equal to 300° C. and lower than or equal to 450° C. Note that the heat treatment may be performed on the multilayer film which has not been processed into the multilayer films 111 and 119.

A heat treatment apparatus used in the heat treatment is not limited to an electric furnace; as the heat treatment apparatus, an apparatus which heats an object using thermal conduction or thermal radiation given by a medium such as a heated gas may be used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

The heat treatment may be performed in an atmosphere of nitrogen, oxygen, ultra-dry air (air in which the water content is 20 ppm or less, preferably 1 ppm or less, further preferably 10 ppb or less), or a rare gas (argon, helium, or the like). The atmosphere of nitrogen, oxygen, ultra-dry air, or a rare gas preferably does not contain hydrogen, water, and the like. Alternatively, the heat treatment may be performed under an atmosphere of an inert gas first, and then under an oxygen atmosphere. The treatment time is 3 minutes to 24 hours.

In the case where a base insulating film is provided between the first substrate 102, and the scan line 107, the capacitor line 115, and the gate insulating film 127, the base insulating film can be formed using any of the following: silicon oxide, silicon oxynitride, silicon nitride, silicon nitride oxide, gallium oxide, yttrium oxide, aluminum oxide, aluminum oxynitride, and the like. The use of silicon nitride, gallium oxide, yttrium oxide, aluminum oxide, or the like for the base insulating film leads to suppression of diffusion of impurities typified by an alkali metal, water, and hydrogen into the multilayer film 111 from the first substrate 102. The base insulating film can be formed by a sputtering method or a PE-CVD method.

Next, the opening 123 reaching the capacitor line 115 is formed in the insulating film 126 to form the gate insulating film 127. After that, the signal line 109 part of which functions as the source electrode of the transistor 103, the conductive film 113 part of which functions as the drain electrode of the transistor 103, and the conductive film 125 which electrically connects the multilayer film 119 and the capacitor line 115 are formed (see FIG. 4B).

The opening 123 can be formed in such a manner that a mask is formed so as to expose part of a portion of the insulating film 126 which overlaps with the capacitor line 115 and processing is performed using the mask. The formation of the mask and the processing can be performed in manners similar to those of the scan line 107 and the capacitor line 115.

The signal line 109 and the conductive films 113 and 125 can be formed as follows: a conductive film is formed using a material which can be used for the signal line 109 and the conductive films 113 and 125, a mask is formed over the conductive film, and processing is performed using the mask. The formation of the mask and the processing can be performed in manners similar to those of the scan line 107 and the capacitor line 115.

Next, an insulating film 128 is formed over the multilayer films 111 and 119, the signal line 109, the conductive films 113 and 125, and the gate insulating film 127. An insulating film 130 is formed over the insulating film 128. An insulating film 133 is formed over the insulating film 130 (see FIG. 5A).

Note that it is preferable that the insulating films 128, 130, and 133 be formed in succession in a vacuum. In such a case, entry of impurities into each interface can be suppressed. Further, in FIG. 5A, the interface between the insulating film 128 and the insulating film 130 is shown by a dotted line. In the case where the insulating film 128 and the insulating film 130 are formed using the same kind of material, the interface between the insulating film 128 and the insulating film 130 cannot be clearly defined in some cases.

The insulating film 128 can be formed using a material that can be used for the insulating film 129, by any of a variety of deposition methods such as a PE-CVD method and a sputtering method. The insulating film 130 can be formed using a material that can be used for the insulating film 131. The insulating film 133 can be formed using a material that can be used for the insulating film 132.

The insulating film 128 (the insulating film 129) can be formed under the following formation conditions. Here, as an oxide insulating film, a silicon oxide film or a silicon oxynitride film is formed. As for the formation conditions, the substrate placed in a treatment chamber of a PE-CVD apparatus, which is vacuum-evacuated, is held at a temperature higher than or equal to 180° C. and lower than or equal to 400° C., preferably higher than or equal to 200° C. and lower than or equal to 370° C., a deposition gas containing silicon and an oxidizing gas are introduced as a source gas into the treatment chamber, the pressure in the treatment chamber is greater than or equal to 20 Pa and less than or equal to 250 Pa, preferably greater than or equal to 40 Pa and less than or equal to 200 Pa, and high-frequency power is supplied to an electrode provided in the treatment chamber.

Typical examples of the deposition gas containing silicon include silane, disilane, trisilane, and silane fluoride. Examples of the oxidizing gas include oxygen, ozone, dinitrogen monoxide, and nitrogen dioxide.

By setting the ratio of the amount of the oxidizing gas to the amount of the deposition gas containing silicon to 100 or higher, the hydrogen content in the insulating film 128 (the insulating film 129) can be reduced and dangling bonds in the insulating film 128 (the insulating film 129) can be reduced. Oxygen released from the insulating film 130 (the insulating film 131) is captured by the dangling bonds in the insulating film 128 (the insulating film 129) in some cases; thus, in the case where the dangling bonds in the insulating film 128 (the insulating film 129) are reduced, oxygen in the insulating film 130 (the insulating film 131) can enter the multilayer films 111 and 119 efficiently to fill oxygen vacancies in the multilayer films 111 and 119. As a result, the amount of hydrogen entering the oxide semiconductor film can be reduced and oxygen vacancies in the oxide semiconductor film can be reduced.

In the case where the above oxide insulating film which includes an oxygen excess region or the above oxide insulating film in which the oxygen content is higher than that in the stoichiometric composition is used as the insulating film 130 (the insulating film 131), the insulating film 130 (the insulating film 131) can be formed under the following formation conditions. Here, as the oxide insulating film, a silicon oxide film or a silicon oxynitride film is formed. As for the formation conditions, the substrate placed in a treatment chamber of a PE-CVD apparatus, which is vacuum-evacuated, is held at a temperature higher than or equal to 180° C. and lower than or equal to 260° C., preferably higher than or equal to 180° C. and lower than or equal to 230° C., the pressure in the treatment chamber is greater than or equal to 100 Pa and less than or equal to 250 Pa, preferably greater than or equal to 100 Pa and less than or equal to 200 Pa with introduction of a source gas into the treatment chamber, and high-frequency power that is higher than or equal to 0.17 W/cm$^2$ and lower than or equal to 0.5 W/cm$^2$, preferably, higher than or equal to 0.25 W/cm$^2$ and lower than or equal to 0.35 W/cm$^2$ is supplied to an electrode provided in the treatment chamber.

As the source gas of the insulating film 130 (the insulating film 131), a source gas which can be used for the insulating film 128 (the insulating film 129) can be used.

As for the formation conditions of the insulating film 130, the high-frequency power having the above power density is supplied to the treatment chamber having the above pressure, whereby the decomposition efficiency of the source gas in plasma is increased, oxygen radicals are increased, and oxidation of the source gas proceeds; therefore, the oxygen content in the insulating film 130 is higher than that in the stoichiometric composition. However, in the case where the substrate temperature is within the above temperature range, the bond between silicon and oxygen is weak, and accordingly, part of oxygen is released by heating. Thus, it is possible to form an oxide insulating film in which the oxygen content is higher than that in the stoichiometric composition and from which part of oxygen is released by heating. The insulating film 128 is provided over the multilayer film 111. Accordingly, in the process for forming the insulating film 130, the insulating film 128 serves as a protective film of the multilayer film 111. Thus, even when the insulating film 130 is formed using the high-frequency power having a high power density, damage to the multilayer film 111 is not significant.

By increasing the thickness of the insulating film 130, a larger amount of oxygen is released by heating; thus, the insulating film 130 is preferably formed thicker than the insulating film 128. Since the insulating film 128 is provided, favorable coverage can be achieved even when the insulating film 130 is formed thick.

In the case where a nitride insulating film with a low hydrogen content is used as the insulating film 133, the insulating film 133 can be formed under the following formation conditions. Here, as the nitride insulating film, a silicon nitride film is formed. The substrate placed in a treatment chamber of the PE-CVD apparatus, which is vacuum-evacuated, is held at a temperature higher than or equal to 80° C. and lower than or equal to 400° C., preferably higher than or equal to 200° C. and lower than or equal to 370° C., the pressure is greater than or equal to 100 Pa and less than or equal to 250 Pa, preferably greater than or equal to 100 Pa and less than or equal to 200 Pa with introduction of a source gas into the treatment chamber, and high-frequency power is supplied to an electrode provided in the treatment chamber.

As the source gas of the insulating film 133, a deposition gas containing silicon, a nitrogen gas, and an ammonia gas are preferably used. Typical examples of the deposition gas containing silicon include silane, disilane, trisilane, and silane fluoride. Further, the flow rate of nitrogen is preferably 5 times to 50 times that of ammonia, further preferably 10 times to 50 times that of ammonia. The use of ammonia as the source gas facilitates decomposition of nitrogen and the deposition gas containing silicon. This is because ammonia is dissociated by plasma energy or heat energy, and energy generated by the dissociation contributes to decomposition of a bond of the deposition gas molecules containing silicon and a bond of nitrogen molecules. Under the above conditions, a silicon nitride film which has a low hydrogen content and can suppress entry of impurities such as hydrogen and water from the outside can be formed.

It is preferable that heat treatment be performed at least after formation of the insulating film 130 so that excess oxygen contained in the insulating film 128 or the insulating film 130 enters the multilayer film 111 to fill oxygen vacancies in the multilayer film 111. The heat treatment can be appropriately performed according to the details of heat treatment for dehydration or dehydrogenation of the multilayer films 111 and 119.

Then, the opening 117 reaching the conductive film 113 is formed in regions of the insulating film 128, the insulating film 130, and the insulating film 133 which overlap with the conductive film 113. By forming the opening 117, each of the insulating films 128, 130, and 133 is divided, whereby the insulating film 129, the insulating film 131, and the insulating film 132 are formed. After that, a light-transmitting conductive film is formed over the conductive film 113, the insulating film 129, the insulating film 131, and the insulating film 132 and unnecessary regions are removed, whereby the pixel electrode 121 is formed (see FIG. 5B).

The opening 117 can be formed in a manner similar to that of the opening 123. The pixel electrode 121 can be formed in such a manner that a light-transmitting conductive film is formed using any of the materials given above in contact with the conductive film 113 through the opening 117, a mask is formed over the conductive film, and processing is performed using the mask. The formation of the mask and the processing can be performed in manners similar to those of the scan line 107 and the capacitor line 115.

Through the above process, the display device which is one embodiment of the present invention can be manufactured.

As described above, according to one embodiment of the present invention, multilayer films each including an oxide semiconductor layer are used in the transistor 103 and the capacitor 105, whereby a display device can be manufactured over a large substrate; thus, a display device with low production cost can be provided. Further, the multilayer film 119 included in the capacitor 105 has a light-transmitting property; thus, the aperture ratio of the pixel becomes high, so that a display device with low power consumption can be provided. Further, a channel is formed in a layer, which is not in contact with the gate insulating film 127, of the multilayer film 111 used for the transistor 103, so that a transistor with stable electrical characteristics can be formed and a display device with high reliability can be manufactured.

Note that this embodiment may be combined as appropriate with a structure or the like described in the other embodiments.

Embodiment 3

In this embodiment, structures of display devices each of which is one embodiment of the present invention, which are different from the structure in Embodiment 1, are described with reference to FIG. 6, FIGS. 7A to 7C, FIG. 8, FIGS. 9A to 9C, FIG. 10, and FIGS. 11A to 11C. Note that in the display devices illustrated in FIG. 6, FIGS. 7A to 7C, FIG. 8, FIGS.

9A to 9C, FIG. 10, and FIGS. 11A to 11C, a liquid crystal layer, elements formed on the second substrate on the opposite side, and the like are not illustrated because the crystal layer, elements, and the like are similar to those illustrated in FIGS. 3A to 3C.

Modification Example 1 of Structure of Display Device

Figure 6:
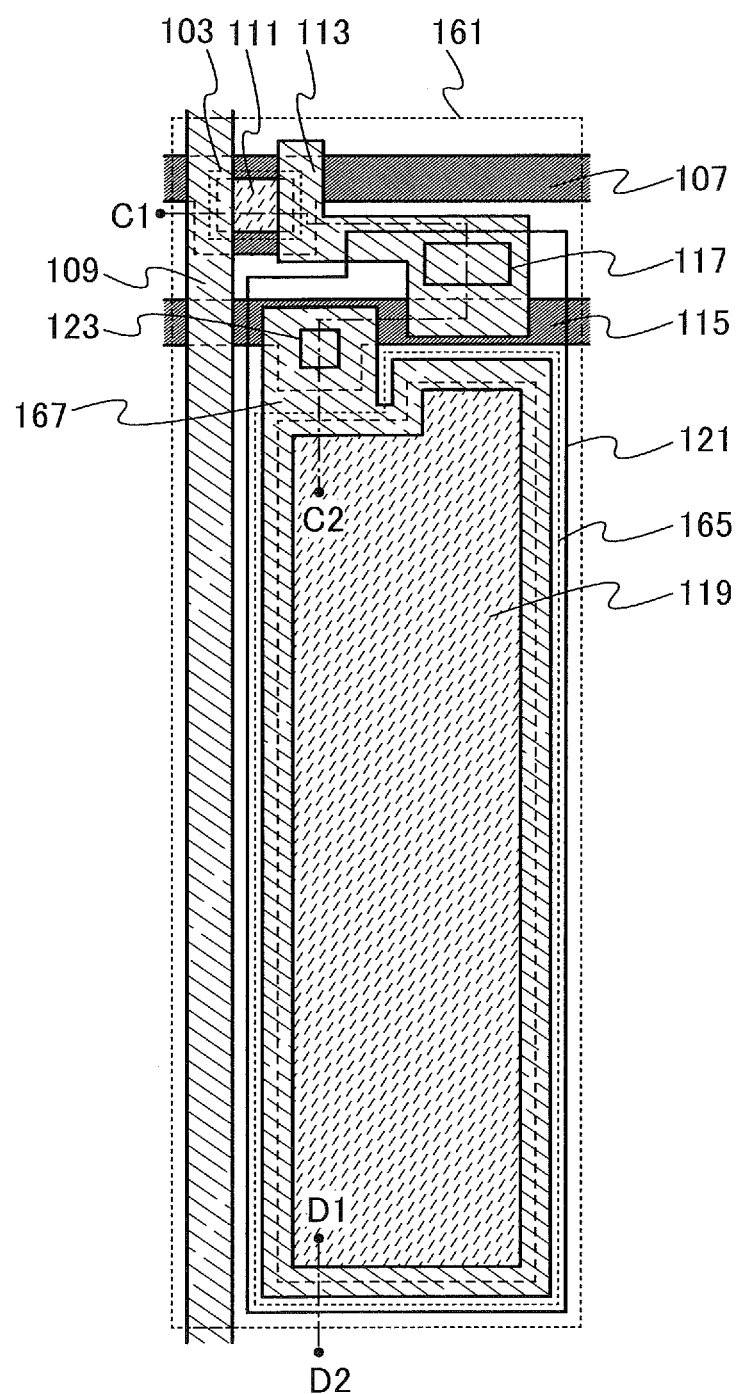
FIG. 6 is a top view illustrating a pixel of a display device of one embodiment of the present invention.

First, a modification example 1 of a structure of a display device is described with reference to FIG. 6 and FIGS. 7A to 7C. Here, only a capacitor 165 different from the capacitor 105 described with reference to FIG. 2 and FIGS. 3A to 3C is described. FIG. 6 is a top view of a pixel 161 and FIGS. 7A to 7C are cross-sectional views taken along dashed-dotted line C1-C2 and dashed-dotted line D1-D2 in FIG. 6.

In the pixel 161, the conductive film 167 is in contact with the multilayer film 119 along the outer periphery thereof and is in contact with the capacitor line 115 through the opening 123. The conductive film 167 is formed in the same formation process as the signal line 109 part of which functions as the source electrode of the transistor 103 and the conductive film 113 part of which functions as the drain electrode of the transistor 103 and thus may have a light-blocking property; for this reason, the area of the conductive film 167 as seen from above is preferably small. However, the conductive film 167 may function as an auxiliary wiring, and a practitioner can determine the most suitable shape as appropriate. The structure of the pixel 161 in FIG. 6 is similar to that in FIG. 2, except for the conductive film 167.

As illustrated in FIG. 7A, in the pixel 161, the conductive film 167 is provided so as to cover end portions of the multilayer film 119 of the capacitor 165.

FIG. 7B and FIG. 7C show an enlarged view of a region α (including the gate insulating film 127, the multilayer film 111, the signal line 109, and the insulating film 129) of the display device illustrated in FIG. 7A and an enlarged view of a region β (including the gate insulating film 127, the multilayer film 119, the conductive film 167, and the insulating film 129) thereof, respectively.

In this embodiment, the structures of the multilayer film 111 and the multilayer film 119 are similar to the structures illustrated in FIG. 3B and FIG. 3C.

In the structure illustrated in FIG. 6 and FIGS. 7A to 7C, the conductive film 167 is formed into a loop shape; however, a portion of the conductive film 167, which is in contact with the multilayer film 119, does not have to be entirely electrically connected to the capacitor line 115. In other words, a conductive film formed in the same formation process as the conductive film 167 may be provided in contact with the multilayer film 119 so as to be separate from the conductive film 167.

With the structure illustrated in FIG. 6 and FIGS. 7A to 7C, the contact resistance between the multilayer film which is the other electrode included in the capacitor and the conductive film which is electrically connected to the capacitor line can be reduced. Further, in the case where the conductivity of the other electrode included in the capacitor is low, the conductive film functions as an auxiliary electrode.

Modification Example 2 of Structure of Display Device

Figure 8:
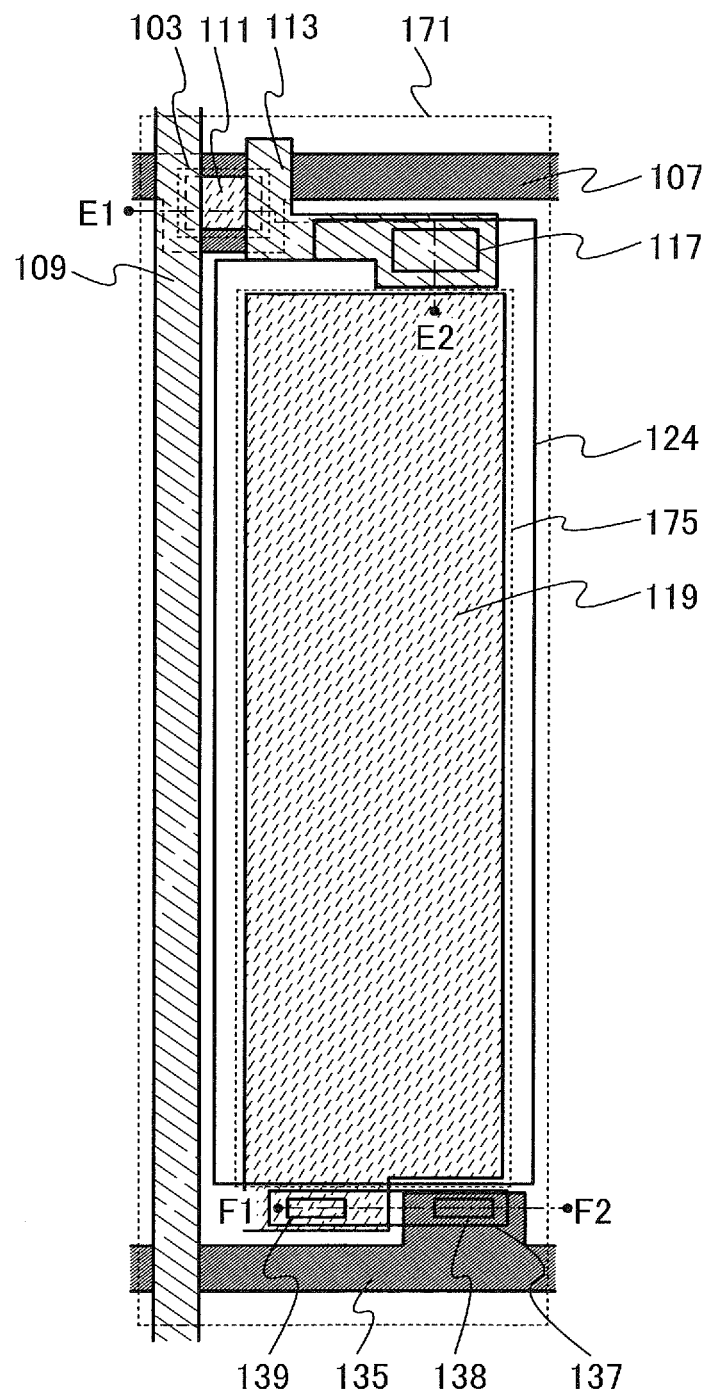
FIG. 8 is a top view illustrating a pixel of a display device of one embodiment of the present invention.

Next, a modification example 2 of a structure of a display device is described with reference to FIG. 8 and FIGS. 9A to 9C. Here, a capacitor 175 different from the capacitor 105 described with reference to FIG. 2 and FIGS. 3A to 3C is described. FIG. 8 is a top view of a pixel 171 and FIGS. 9A to 9C are cross-sectional views taken along dashed-dotted line E1-E2 and dashed-dotted line F1-F2 in FIG. 8.

In the pixel 171, an opening 139 reaching the multilayer film 119 is formed in the insulating film 129, the insulating film 131, and the insulating film 132, and an opening 138 reaching a conductive film 135 is formed in the gate insulating film 127, the insulating film 129, the insulating film 131, and the insulating film 132. Further, a conductive film 137 is formed so as to cover the opening 139, the opening 138, and the insulating film 132.

In the capacitor 175, a pixel electrode 124 functions as one electrode and the multilayer film 119 functions as the other electrode. Note that the multilayer film 119 is connected to the conductive film 135 formed in the same process as the scan line 107 through the conductive film 137 formed in the same process as the pixel electrode 124. By using such a connection method, the openings 117, 139, and 138 can be formed in the same process; thus, the number of masks can be reduced.

Figure 9A:
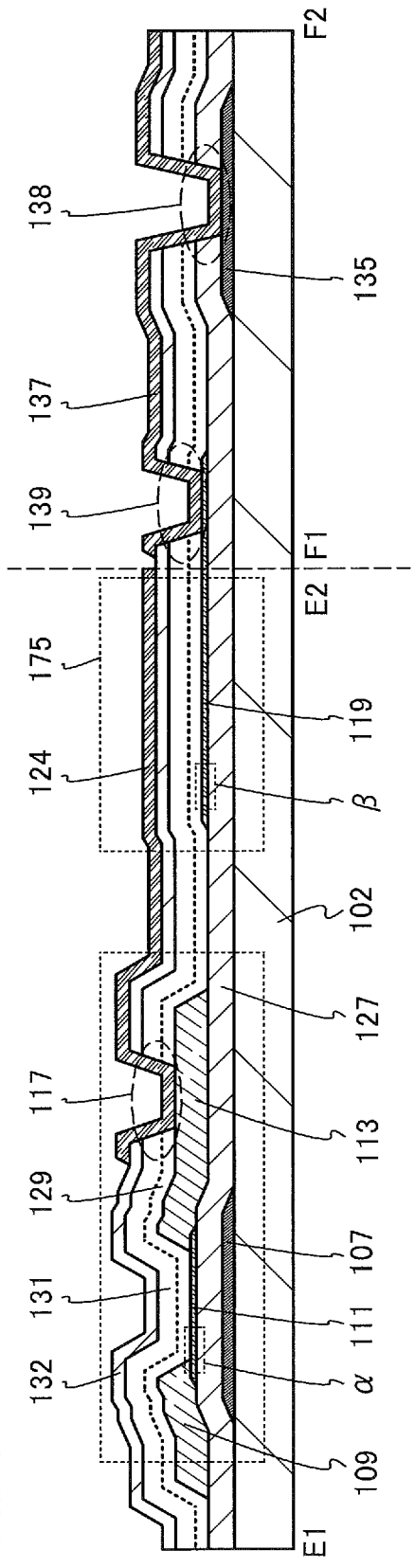
FIGS. 9A to 9C are cross-sectional views illustrating a display device of one embodiment of the present invention.
Figure 9C:
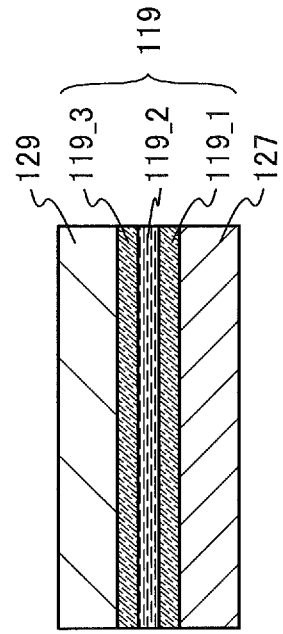
Figure 9B:
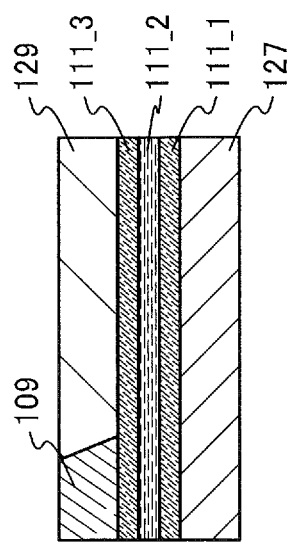

FIG. 9B and FIG. 9C show an enlarged view of a region α (including the gate insulating film 127, the multilayer film 111, the signal line 109, and the insulating film 129) of the display device illustrated in FIG. 9A and an enlarged view of a region β (including the gate insulating film 127, the multilayer film 119, and the insulating film 129) thereof, respectively.

In this embodiment, the structures of the multilayer film 111 and the multilayer film 119 are similar to the structures illustrated in FIG. 3B and FIG. 3C.

Modification Example 3 of Structure of Display Device

Figure 10:
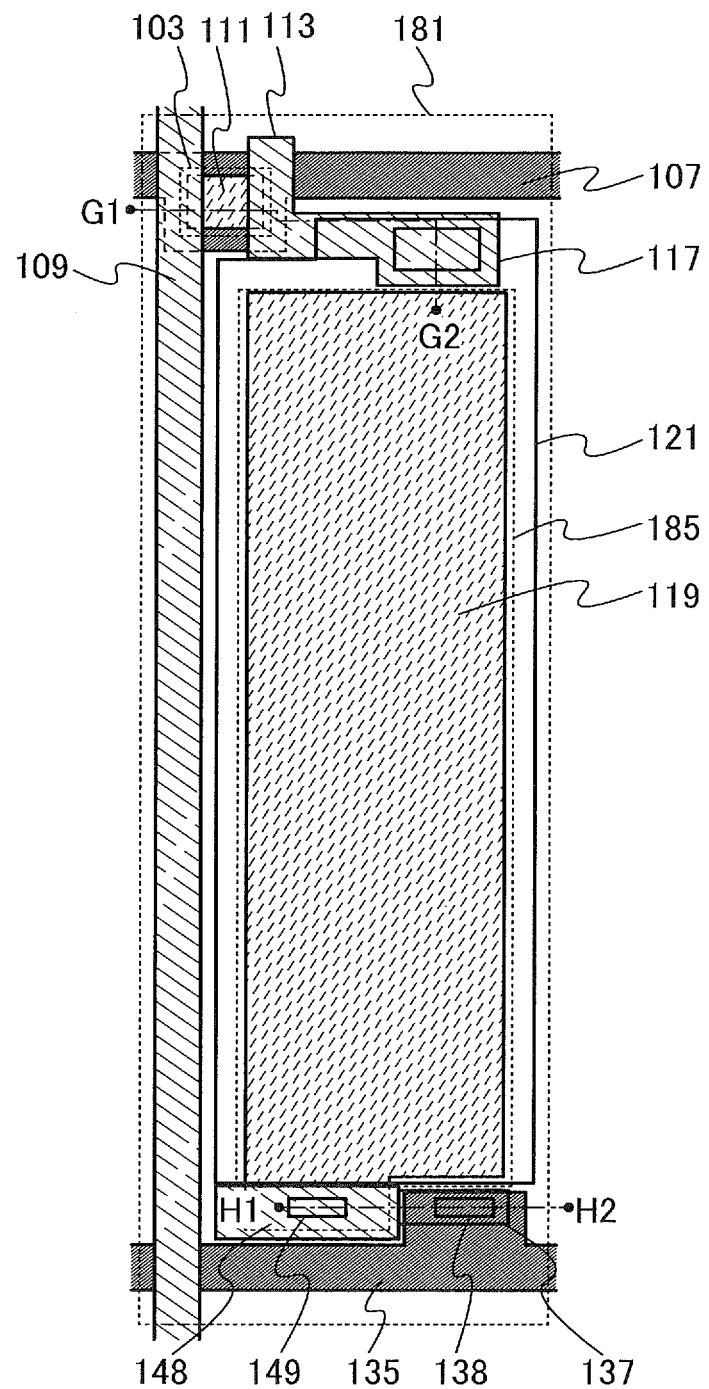
FIG. 10 is a top view illustrating a pixel of a display device of one embodiment of the present invention.

Next, a modification example 3 of a structure of a display device is described with reference to FIG. 10 and FIGS. 11A to 11C. Here, a capacitor 185 different from the capacitor 175 described with reference to FIG. 8 and FIGS. 9A to 9C is described. FIG. 10 is a top view of a pixel 181 and FIGS. 11A to 11C are cross-sectional views taken along dashed-dotted line G1-G2 and dashed-dotted line H1-H2 in FIG. 10.

In the pixel 181, an opening 149 reaching the conductive film 148 formed in the same process as the conductive film 113 is formed in the insulating film 129, the insulating film 131, and the insulating film 132, and the opening 138 reaching the conductive film 135 is formed in the gate insulating film 127, the insulating film 129, the insulating film 131, and the insulating film 132. Further, the conductive film 137 is formed so as to cover the opening 138, the opening 149, and the insulating film 132.

In the capacitor 185, the pixel electrode 124 functions as one electrode and the multilayer film 119 functions as the other electrode. Note that the multilayer film 119 is connected to the conductive film 135 formed in the same process as the scan line 107 through the conductive film 148 and the conductive film 137 which is formed in the same process as the pixel electrode 124. By using such a connection method, the openings 117, 149, and 138 can be formed in the same process; thus, the number of masks can be reduced. Further, the connection resistance between the multilayer film 119 and the conductive film 137 can be reduced with the conductive film 148 provided therebetween.

Figure 11A:
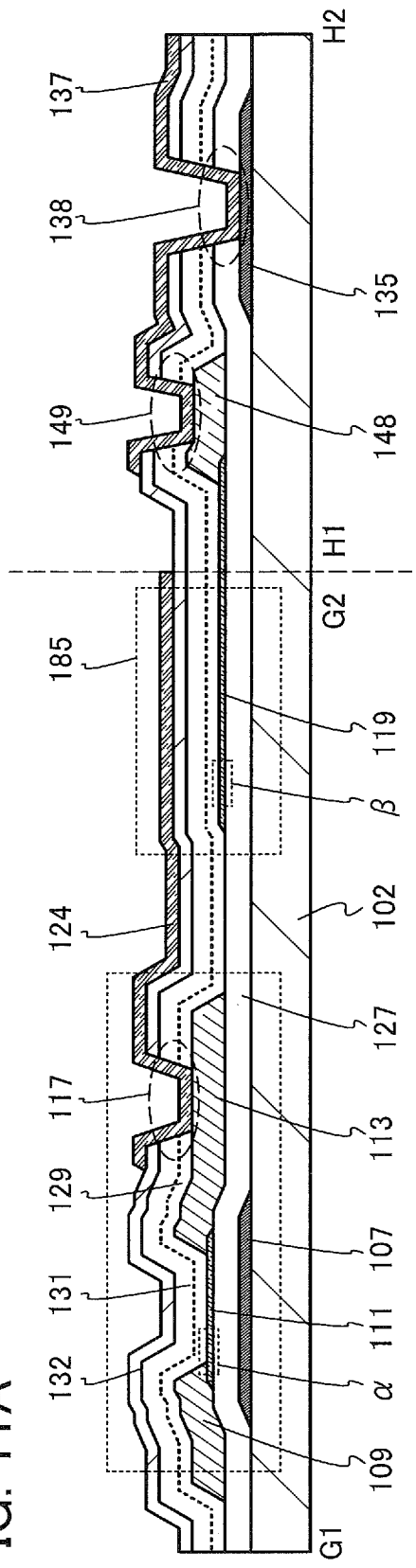
FIGS. 11A to 11C are cross-sectional views illustrating a display device of one embodiment of the present invention.
Figure 11C:
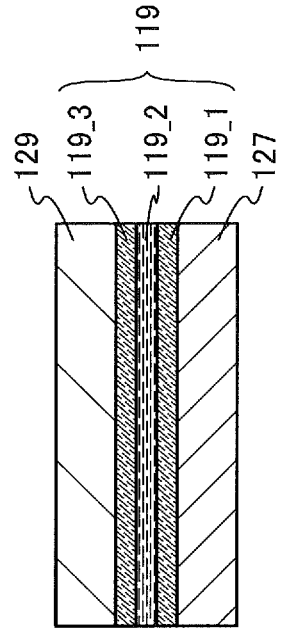
Figure 11B:
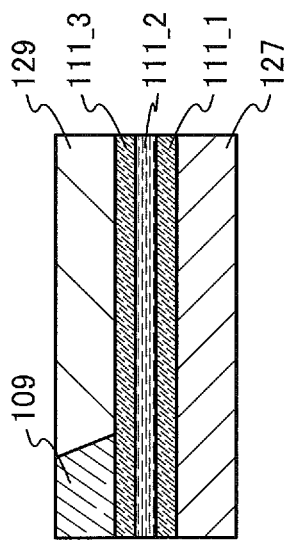

FIG. 11B and FIG. 11C show an enlarged view of a region α (including the gate insulating film 127, the multilayer film 111, the signal line 109, and the insulating film 129) of the display device illustrated in FIG. 11A and an enlarged view of a region β (including the gate insulating film 127, the multilayer film 119, and the insulating film 129) thereof, respectively.

In this embodiment, the structures of the multilayer film 111 and the multilayer film 119 are similar to the structures illustrated in FIG. 3B and FIG. 3C.

Note that the structure and the like described in this embodiment can be used as appropriate in combination with any of the structures and the like in the other embodiments.

Embodiment 4

In this embodiment, one embodiment which can be applied to a multilayer film including an oxide semiconductor layer in the transistor and the capacitor included in the display device described in the above embodiments is described.

At least one layer of the multilayer film including the oxide semiconductor layer is preferably formed using any of an oxide semiconductor such as an amorphous oxide semiconductor, in which a crystal part is not clearly observed, a single crystal oxide semiconductor, a polycrystalline oxide semiconductor, and an oxide semiconductor including a crystal part (a c-axis aligned crystalline oxide semiconductor: CAAC-OS).

The CAAC-OS is one of oxide semiconductor films including a plurality of crystal parts, and most of the crystal parts each fit inside a cube whose one side is less than 100 nm. Thus, there is a case where a crystal part included in the CAAC-OS fits inside a cube whose one side is less than 10 nm, less than 5 nm, or less than 3 nm. The density of defect states of the CAAC-OS is lower than that of the microcrystalline oxide semiconductor film. The CAAC-OS is described in detail below.

In a transmission electron microscope (TEM) image of the CAAC-OS, a boundary between crystal parts, that is, a grain boundary is not clearly observed. Thus, in the CAAC-OS, a reduction in electron mobility due to the grain boundary is less likely to occur.

According to the TEM image of the CAAC-OS observed in a direction substantially parallel to a sample surface (cross-sectional TEM image), metal atoms are arranged in a layered manner in the crystal parts. Each metal atom layer has a morphology reflected by a surface over which the CAAC-OS is formed (hereinafter, a surface over which the CAAC-OS is formed is referred to as a formation surface) or a top surface of the CAAC-OS, and is arranged in parallel to the formation surface or the top surface of the CAAC-OS.

On the other hand, according to the TEM image of the CAAC-OS observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS.

A CAAC-OS is subjected to structural analysis with an X-ray diffraction (XRD) apparatus. For example, when the CAAC-OS including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

On the other hand, when the CAAC-OS is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS, a peak is not clearly observed even when φ scan is performed with 2θ fixed at around 56°.

According to the above results, in the CAAC-OS having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS is changed by etching or the like, the c-axis might not be necessarily parallel to a normal vector of a formation surface or a normal vector of a top surface of the CAAC-OS.

Further, the degree of crystallinity in the CAAC-OS is not necessarily uniform. For example, in the case where crystal growth leading to the CAAC-OS occurs from the vicinity of the top surface of the film, the degree of the crystallinity in the vicinity of the top surface is higher than that in the vicinity of the formation surface in some cases. Further, when an impurity is added to the CAAC-OS, the crystallinity in a region to which the impurity is added is changed, and the degree of crystallinity in the CAAC-OS varies depending on regions.

Note that when the CAAC-OS with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS. It is preferable that in the CAAC-OS, a peak of 2θ appear at around 31° and a peak of 2θ do not appear at around 36°.

There are three methods for forming a CAAC-OS.

The first method is to form an oxide semiconductor film at a temperature higher than or equal to 100° C. and lower than or equal to 450° C. to form, in the oxide semiconductor film, crystal parts in which the c-axes are aligned in the direction parallel to a normal vector of a surface where the oxide semiconductor film is formed or a normal vector of a surface of the oxide semiconductor film.

The second method is to form an oxide semiconductor film with a small thickness and then heat it at a temperature higher than or equal to 200° C. and lower than or equal to 700° C. to form, in the oxide semiconductor film, crystal parts in which the c-axes are aligned in the direction parallel to a normal vector of a surface where the oxide semiconductor film is formed or a normal vector of a surface of the oxide semiconductor film.

The third method is to form a first oxide semiconductor film with a small thickness, then heat it at a temperature higher than or equal to 200° C. and lower than or equal to 700° C., and form a second oxide semiconductor film to form, in the second oxide semiconductor film, crystal parts in which the c-axes are aligned in the direction parallel to a normal vector of a surface where the second oxide semiconductor film is formed or to a normal vector of a surface of the second oxide semiconductor film.

In a transistor using the CAAC-OS for an oxide semiconductor film, change in the electrical characteristics of the transistor due to irradiation with visible light or ultraviolet light is small. Thus, the transistor using the CAAC-OS as the oxide semiconductor film has high reliability.

Further, it is preferable that the CAAC-OS be formed by a sputtering method using a polycrystalline oxide semiconductor target. When ions collide with the target, a crystal region included in the target may be separated from the target along an a-b plane; in other words, a sputtered particle having a plane parallel to an a-b plane (flat-plate-like sputtered particle or pellet-like sputtered particle) may flake off from the target. In that case, the flat-plate-like or pellet-like sputtered particle reaches a surface where the CAAC-OS is formed while maintaining their crystal state, whereby the CAAC-OS can be formed.

The conditions described below are preferably employed for the formation of the CAAC-OS.

By reducing the amount of impurities entering the CAAC-OS during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the heating temperature of the surface where the CAAC-OS is formed (for example, the substrate heating temperature) during the deposition, migration of a sputtered particle is likely to occur after the sputtered particle reaches the surface where the CAAC-OS is formed. Specifically, the temperature of the surface where the CAAC-OS is formed during the deposition is higher than or equal to 100° C. and lower than or equal to 740° C., preferably higher than or equal to 150° C. and lower than or equal to 500° C. By increasing the temperature of the surface where the CAAC-OS is formed during the deposition, when the flat-plate-like or pellet-like sputtered particle reaches the surface where the CAAC-OS is formed, migration occurs on the surface, so that a flat plane of the sputtered particle is attached to the surface.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the target, an In—Ga—Zn-based oxide target is described below.

The In—Ga—Zn oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. This pressure treatment may be performed while cooling is performed or may be performed while heating is performed. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired target.

Note that the structures and the like described in this embodiment can be combined as appropriate with any of the structures and the like described in the other embodiments.

Embodiment 5

In this embodiment, an example in which a system-on-panel is formed by forming the display device an example of which is described in the above embodiments and part or all of a driver circuit over a substrate where a pixel portion is formed is described with reference to FIGS. 12A to 12C, FIGS. 13A and 13B, and FIGS. 14A to 14C. FIGS. 13A and 13B are each a cross-sectional view illustrating a cross-sectional portion taken along the dashed-dotted line M-N in FIG. 12B. Note that in FIGS. 13A and 13B, only part of the structure of the pixel portion is illustrated.

Figure 12A:
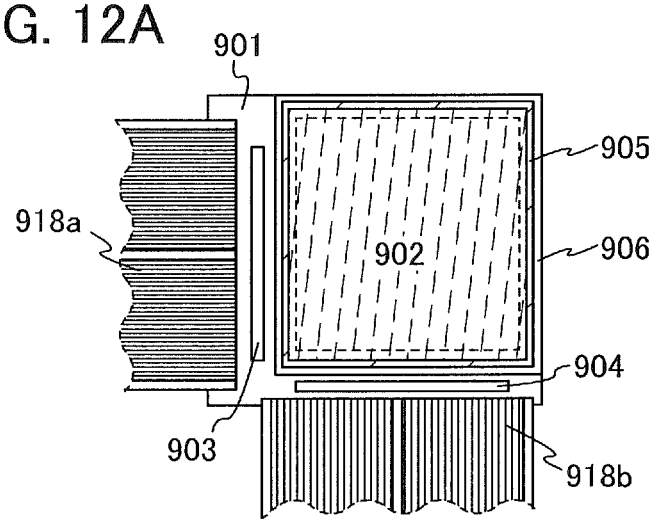
FIGS. 12A to 12C are top views each illustrating a display device of one embodiment of the present invention.
Figure 13A:
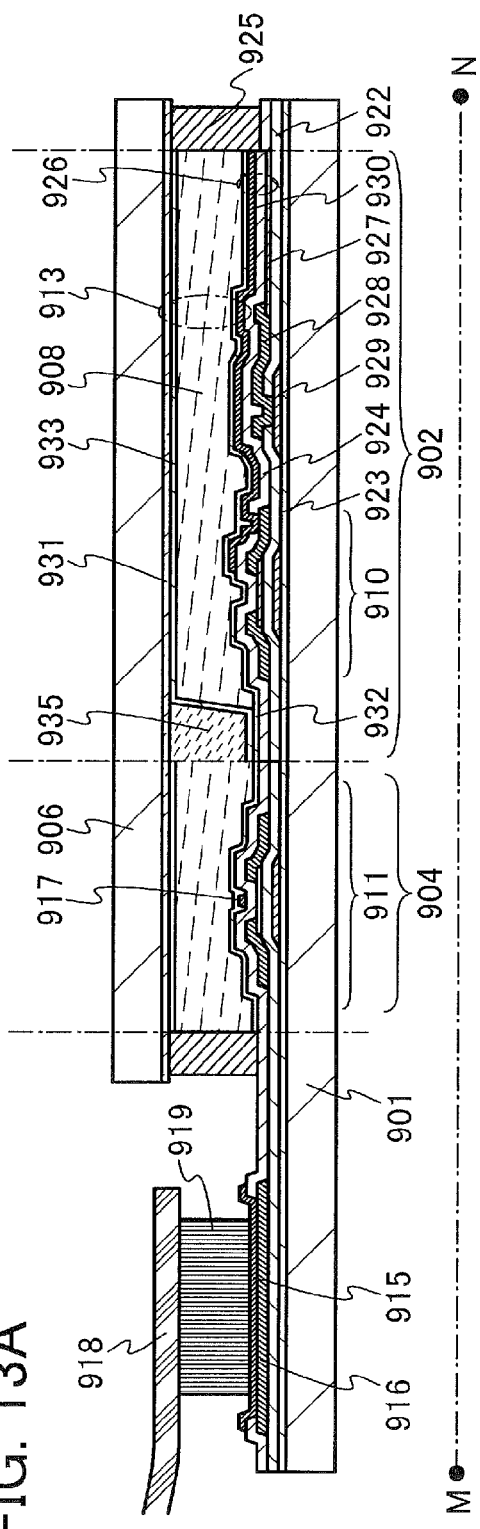
FIGS. 13A and 13B are cross-sectional views each illustrating a display device of one embodiment of the present invention.
Figure 13B:
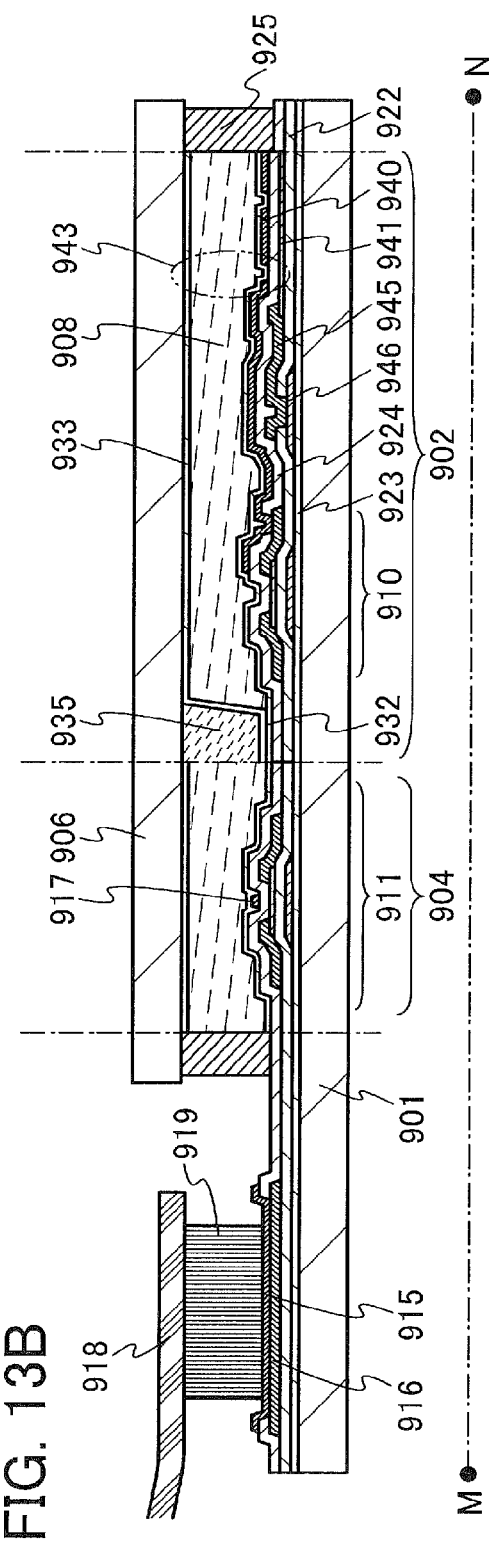

In FIG. 12A, a sealant 905 is provided so as to surround a pixel portion 902 provided over a first substrate 901, and the pixel portion 902 is sealed with a second substrate 906. In FIG. 12A, a signal line driver circuit 903 and a scan line driver circuit 904 each are formed using a single crystal semiconductor or a polycrystalline semiconductor over a substrate prepared separately, and mounted in a region different from the region surrounded by the sealant 905 over the first substrate 901. Further, various signals and potentials are supplied to the signal line driver circuit 903, the scan line driver circuit 904, and the pixel portion 902 from flexible printed circuits (FPCs) 918a and 918b.

Figure 12B:
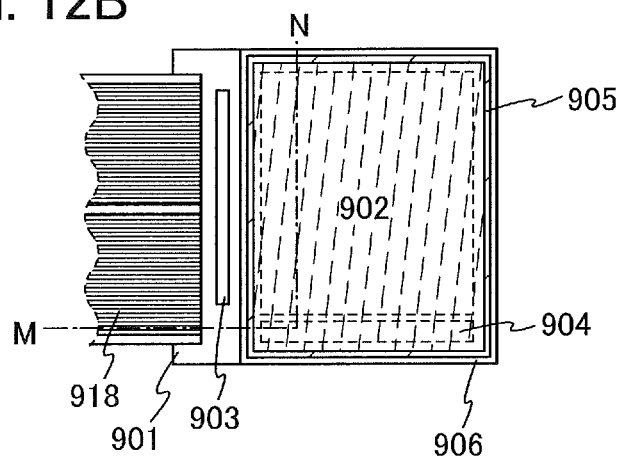
Figure 12C:
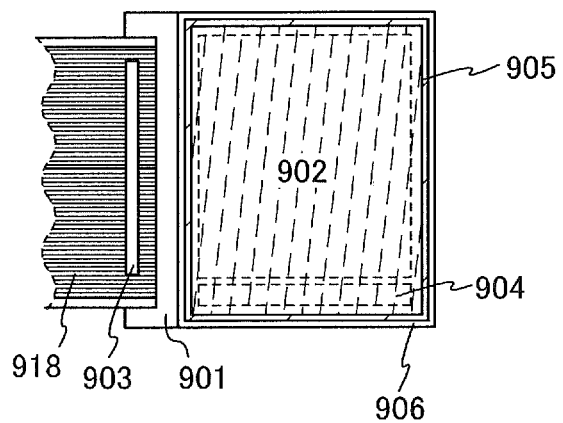

In FIGS. 12B and 12C, the sealant 905 is provided so as to surround the pixel portion 902 and the scan line driver circuit 904 which are provided over the first substrate 901. The second substrate 906 is provided over the pixel portion 902 and the scan line driver circuit 904. Thus, the pixel portion 902 and the scan line driver circuit 904 are sealed together with a display element by the first substrate 901, the sealant 905, and the second substrate 906. In FIGS. 12B and 12C, a signal line driver circuit 903 which is formed using a single crystal semiconductor or a polycrystalline semiconductor over a substrate prepared separately is mounted in a region different from the region surrounded by the sealant 905 over the first substrate 901. In FIGS. 12B and 12C, various signals and potentials are supplied to the signal line driver circuit 903, the scan line driver circuit 904, and the pixel portion 902 from an FPC 918.

Although FIGS. 12B and 12C each illustrate an example in which the signal line driver circuit 903 is formed separately and mounted on the first substrate 901, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 12A illustrates an example in which the signal line driver circuit 903 and the scan line driver circuit 904 are mounted by a COG method. FIG. 12B illustrates an example in which the signal line driver circuit 903 is mounted by a COG method. FIG. 12C illustrates an example in which the signal line driver circuit 903 is mounted by a TAB method.

The display device includes, in its category, a panel in which a display element is sealed, and a module in which an IC or the like including a controller is mounted on the panel.

A display device in this specification refers to an image display device, a display device, or a light source (including a lighting device). Furthermore, the display device also includes the following modules in its category: a module to which a connector such as an FPC, or a TCP is attached; a module having a TCP at the tip of which a printed wiring board is provided; and a module in which an integrated circuit (IC) is directly mounted on a display element by a COG method.

The pixel portion and the scan line driver circuit provided over the first substrate include a plurality of transistors and any of the transistors which are described in the above embodiments can be used.

As the display element provided in the display device, a liquid crystal element (also referred to as liquid crystal display element) or a light-emitting element (also referred to as light-emitting display element) can be used. A light-emitting element includes, in its scope, an element whose luminance is controlled by current or voltage, and specifically includes an inorganic electroluminescent (EL) element, an organic EL element, and the like. Furthermore, a display medium whose contrast is changed by an electric effect, such as electronic ink, can be used. FIGS. 13A and 13B illustrate an example of a liquid crystal display device using a liquid crystal element as a display element.

The liquid crystal display device illustrated in FIG. 13A is a vertical electric field mode liquid crystal display device. The liquid crystal display device includes a connection terminal electrode 915 and a terminal electrode 916. The connection terminal electrode 915 and the terminal electrode 916 are electrically connected to a terminal included in the FPC 918 through an anisotropic conductive agent 919.

The connection terminal electrode 915 is formed using the same conductive film as a first electrode 930. The terminal electrode 916 is formed using the same conductive film as source and drain electrodes of transistors 910 and 911.

Further, the pixel portion 902 and the scan line driver circuit 904 which are provided over the first substrate 901 each include a plurality of transistors, and the transistor 910 included in the pixel portion 902 and the transistor 911 included in the scan line driver circuit 904 are illustrated as an examples. An insulating film 924 corresponding to the insulating films 129, 131, and 132 described in Embodiment 1 is provided over the transistors 910 and 911. Note that an insulating film 923 is an insulating film serving as a base film.

In this embodiment, the transistor described in the above embodiments can be applied to the transistors 910 and 911. A capacitor 926 is formed using an oxide semiconductor film 927, the insulating film 924, and the first electrode 930. The oxide semiconductor film 927 is connected to a capacitor wiring 929 through an electrode 928. The electrode 928 is formed using the same conductive film as the source and drain electrodes of each of the transistors 910 and 911. The capacitor wiring 929 is formed using the same conductive film as a gate electrode of each of the transistors 910 and 911. Although the capacitor described in Embodiment 1 is illustrated as the capacitor 926 here, any of the capacitors in the other embodiments may be used as appropriate.

Moreover, an example in which a conductive film 917 is provided over the insulating film 924 so as to overlap with a channel formation region of the oxide semiconductor film of the transistor 911 included in the scan line driver circuit is illustrated. In this embodiment, the conductive film 917 is formed using the same conductive film as the first electrode 930 and a first electrode 940. By providing the conductive film 917 so as to overlap with a channel formation region of the oxide semiconductor film, the amount of change in the threshold voltage of the transistor 911 between before and after a reliability test (e.g., a bias temperature (BT) stress test) can be further reduced. The conductive film 917 may have the same potential as or a potential different from that of the gate electrode of the transistor 911, and the conductive film 917 can serve as a second gate electrode. The potential of the conductive film 917 is set to a ground potential, a source potential, a fixed potential, or a potential of a gate electrode, for example.

In addition, the conductive film 917 has a function of blocking an external electric field. In other words, the conductive film 917 has a function of preventing an external electric field (particularly, a function of preventing static electricity) from affecting the inside (a circuit portion including the transistor). Such a blocking function of the conductive film 917 can prevent variation in the electric characteristics of the transistor due to an influence of an external electric field such as static electricity. Further, the threshold voltage of the transistor can be controlled. Note that although the transistors included in the scan line driver circuit are illustrated in FIGS. 13A and 13B, in a manner similar to that of the transistor 911, a transistor included in the signal line driver circuit may have a structure in which a conductive film is provided over the insulating film 924 so as to overlap with a channel formation region of the oxide semiconductor film.

The transistor 910 provided in the pixel portion 902 is electrically connected to the display element to form a display panel. There is no particular limitation on the kind of the display element as long as display can be performed, and any of various kinds of display elements can be employed.

A liquid crystal element 913 which is a display element includes the first electrode 930, a second electrode 931, and a liquid crystal layer 908. An insulating film 932 and an insulating film 933 which serve as alignment films are provided so that the liquid crystal layer 908 is interposed therebetween. The second electrode 931 is provided on the second substrate 906 side. The second electrode 931 overlaps with the first electrode 930 with the liquid crystal layer 908 interposed therebetween.

The first electrode and the second electrode (each of which is also referred to as a pixel electrode, a common electrode, a counter electrode, or the like) for applying voltage to the display element may have light-transmitting properties or light-reflecting properties, which depends on the direction in which light is extracted, the position where the electrode is provided, and the pattern structure of the electrode.

The first electrode 930 and the second electrode 931 can be formed using materials similar to those of the pixel electrode 121 and the counter electrode 154 in Embodiment 1 as appropriate.

A spacer 935 is a columnar spacer obtained by selectively etching an insulating film and is provided in order to control the distance (cell gap) between the first electrode 930 and the second electrode 931. Alternatively, a spherical spacer may be used.

In the case where a liquid crystal element is used as the display element, thermotropic liquid crystal, low-molecular liquid crystal, high-molecular liquid crystal, polymer-dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed is used for the liquid crystal layer in order to improve the temperature range. Note that the alignment film is formed using an organic resin containing hydrogen, water, or the like, which might degrade the electrical characteristics of the transistor in the display device of one embodiment of the present invention. In view of the above, the use of liquid crystal which exhibits a blue phase for the liquid crystal layer 160 enables manufacture of the display device of one embodiment of the present invention without an organic resin, so that the display device can be highly reliable.

The first substrate 901 and the second substrate 906 are fixed in place by a sealant 925. As the sealant 925, an organic resin such as a thermosetting resin or a photocurable resin can be used. The sealant 925 is in contact with the insulating film 924. Note that the sealant 925 corresponds to the sealant 905 illustrated in FIGS. 12A to 12C.

In the liquid crystal display device, a black matrix (light-blocking film), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a side light, or the like may be used as a light source.

Since the transistor is easily broken due to static electricity or the like, a protective circuit for protecting the driver circuit is preferably provided. The protection circuit is preferably formed using a nonlinear element.

Next, a transverse electric field mode liquid crystal display device is described with reference to FIG. 13B. FIG. 13B illustrates a liquid crystal display device of a fringe field switching (FFS) mode, which is one of transverse electric field modes. A structure which is different from that of the liquid crystal display device of the vertical electric field mode illustrated in FIG. 13A is described.

In the liquid crystal display device illustrated in FIG. 13B, the connection terminal electrode 915 is formed using the same conductive film as a first electrode 940, and the terminal electrode 916 is formed using the same conductive film as the source and drain electrodes of each of the transistors 910 and 911.

A liquid crystal element 943 includes the first electrode 940 over the insulating film 924, a second electrode 941, and the liquid crystal layer 908. Note that the liquid crystal element 943 can have a structure similar to that of the capacitor 105 described in Embodiment 1. The first electrode 940 can be formed using, as appropriate, the material for the first electrode 930 illustrated in FIG. 13A. The planar shape of the first electrode 940 is a comb-like shape, a staircase-like shape, a ladder-like shape, or the like. The second electrode 941 functions as a common electrode and can be formed in a manner similar to that of the multilayer film 119 described in Embodiment 1. The insulating film 924 is provided between the first electrode 940 and the second electrode 941.

The second electrode 941 is connected to a common wiring 946 through an electrode 945. The electrode 945 is formed using the same conductive film as the source and drain electrodes of each of the transistors 910 and 911. The common wiring 946 is formed using the same conductive film as the gate electrode of each of the transistors 910 and 911. Although the description is made using the capacitor described in Embodiment 1 as the liquid crystal element 943 here, any of the capacitors described in the other embodiments can be used as appropriate.

Figure 14A:
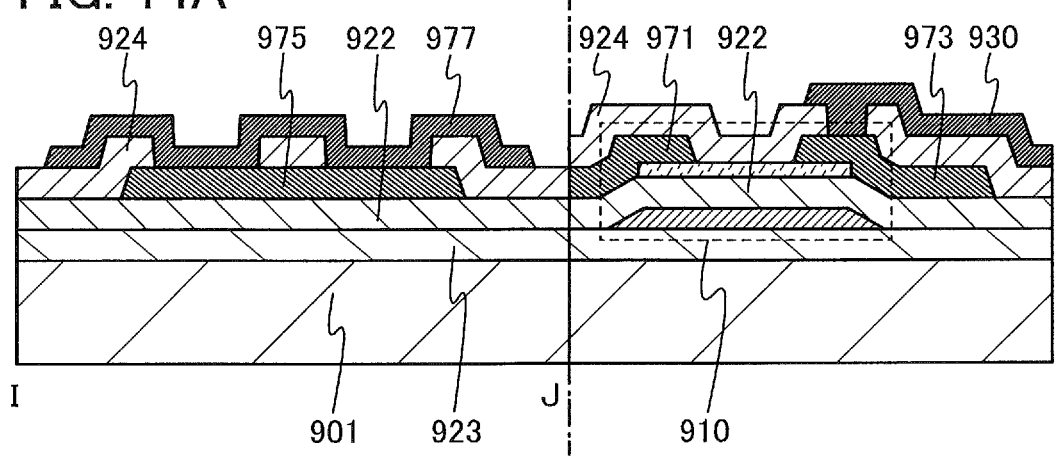
FIGS. 14A to 14C are cross-sectional views and a top view each illustrating a display device of one embodiment of the present invention.
Figure 14B:
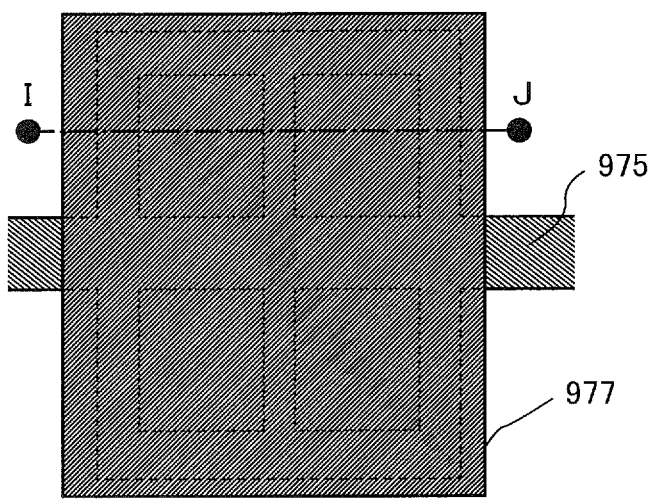
Figure 14C:
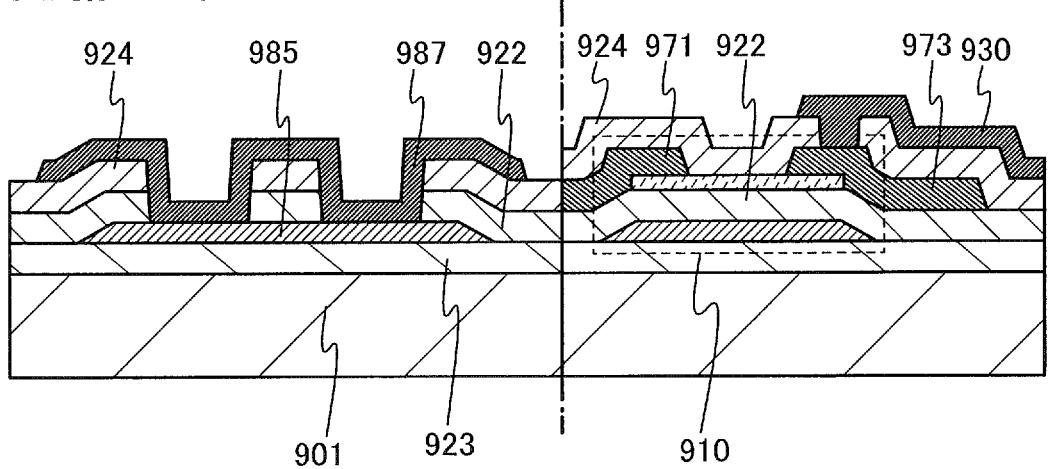

FIGS. 14A to 14C illustrate an example of the liquid crystal display device illustrated in FIG. 13A in which a common connection portion (pad portion) for being electrically connected to the second electrode 931 provided on the second substrate 906 is formed over the first substrate 901.

The common connection portion is provided in a position which overlaps with the sealant for bonding the first substrate 901 and the second substrate 906, and is electrically connected to the second electrode 931 through conductive particles contained in the sealant. Alternatively, the common connection portion is provided in a position which does not overlap with the sealant (except for the pixel portion) and a paste containing conductive particles is provided separately from the sealant so as to overlap with the common connection portion, whereby the common connection portion is electrically connected to the second electrode 931.

FIG. 14A is a cross-sectional view of the common connection portion taken along the line I-J in a top view of FIG. 14B.

A common potential line 975 is provided over the gate insulating film 922 and is formed using the same material and through the same steps as a source electrode 971 and a drain electrode 973 of the transistor 910 illustrated in FIGS. 14A to 14C.

Further, the common potential line 975 is covered with the insulating film 924, and a plurality of openings are formed in the insulating film 924 at positions overlapping with the common potential line 975. These openings are formed through the same steps as a contact hole which connects the first electrode 930 and one of the source electrode 971 and the drain electrode 973 of the transistor 910.

Further, the common potential line 975 is connected to the common electrode 977 through the openings. The common electrode 977 is provided over the interlayer insulating film 924 and formed using the same material and through the same steps as the connection terminal electrode 915 and the first electrode 930 in the pixel portion.

In this manner, the common connection portion can be manufactured in the same process as the switching element in the pixel portion 902.

The common electrode 977 is an electrode in contact with the conductive particles contained in the sealant, and is electrically connected to the second electrode 931 of the second substrate 906.

As illustrated in FIG. 14C, a common potential line 985 may be formed using the same material and through the same steps as the gate electrode of the transistor 910.

In the common connection portion in FIG. 14C, the common potential line 985 is provided under the gate insulating film 922 and the insulating film 924, and a plurality of openings are formed in the gate insulating film 922 and the insulating film 924 at positions overlapping with the common potential line 985. These openings are formed by etching the insulating film 924 and further selectively etching the gate insulating film 922, through the same steps as a contact hole which connects the first electrode 930 and one of the source electrode 971 and the drain electrode 973 of the transistor 910.

Further, the common potential line 985 is connected to the common electrode 987 through the openings. The common electrode 987 is provided over the insulating film 924 and formed using the same material and through the same steps as the connection terminal electrode 915 and the first electrode 930 in the pixel portion.

As described above, according to one embodiment of the present invention, the use of a multilayer film including an oxide semiconductor layer for a transistor and a capacitor allows a display device to be manufactured over a large substrate; thus, the display device can be manufactured at low cost. In addition, since the multilayer film used for the capacitor has a light-transmitting property, the aperture ratio of a pixel can be increased, so that the display device can have low power consumption. Moreover, since a channel is formed in the layer in the multilayer film used for the transistor which is not in contact with a gate insulating film, the transistor can have stable electrical characteristics, so that the display device can have high reliability.

Note that the structures and the like described in this embodiment can be combined as appropriate with any of the structures and the like described in the other embodiments.

Embodiment 6

The display device which is one embodiment of the present invention can be applied to a variety of electronic appliances (including game machines). Examples of electronic appliances include a television device (also referred to as television or television receiver), a monitor of a computer or the like, a camera such as a digital camera or a digital video camera, a digital photo frame, a mobile phone, a portable game machine, a portable information terminal, an audio reproducing device, a game machine (e.g., a pachinko machine or a slot machine), and a game console. Examples of these electronic appliances are illustrated in FIGS. 15A to 15C.

Figure 15A:
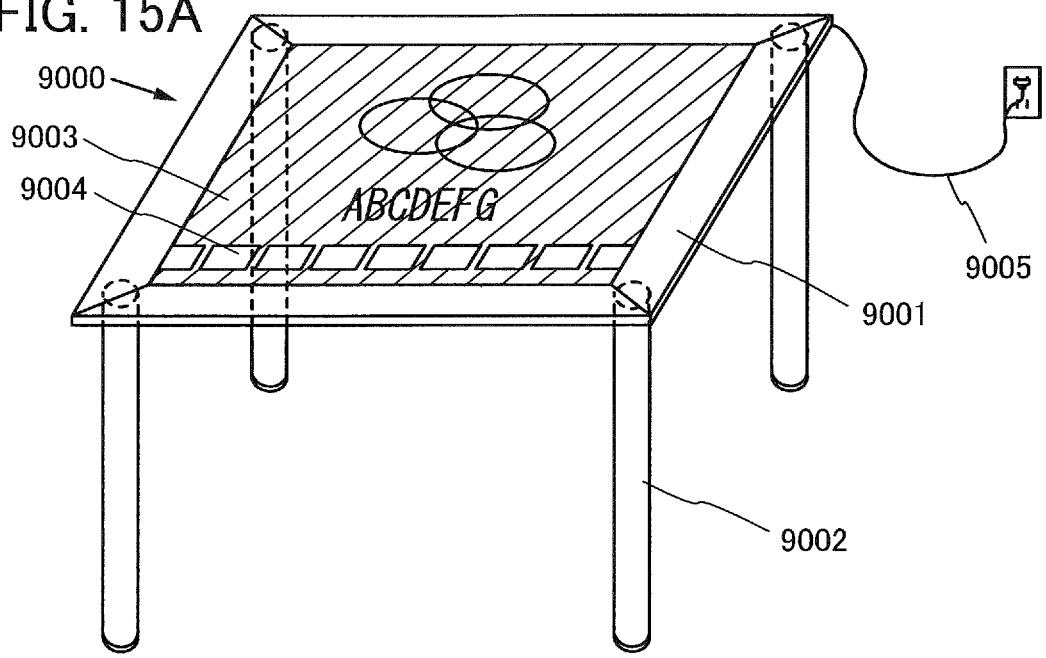
FIGS. 15A to 15C each illustrate an electronic appliance including a display device of one embodiment of the present invention.
Figure 15B:
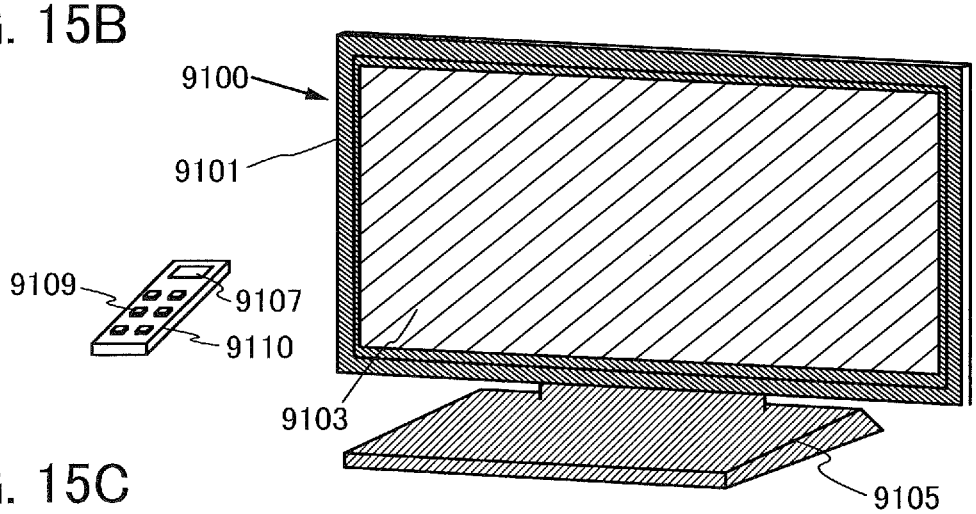
Figure 15C:
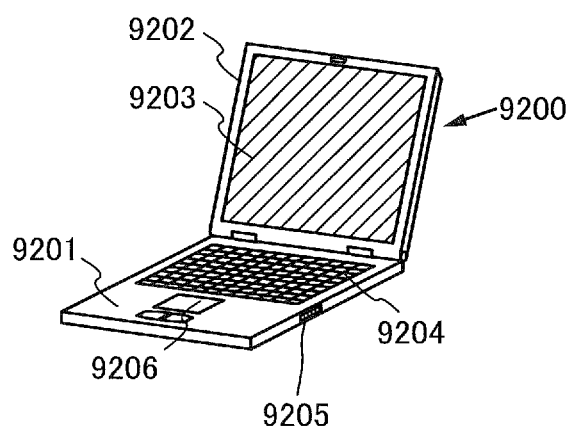

FIG. 15A illustrates a table 9000 having a display portion. In the table 9000, a display portion 9003 is incorporated in a housing 9001 and an image can be displayed on the display portion 9003. The housing 9001 is supported by four leg portions 9002. Further, a power cord 9005 for supplying power is provided for the housing 9001.

The display device described in any of the above embodiments can be used for the display portion 9003. Thus, the display portion 9003 can have high display quality.

The display portion 9003 has a touch-input function. When a user touches displayed buttons 9004 which are displayed on the display portion 9003 of the table 9000 with his/her fingers or the like, the user can carry out operation of the screen and input of information. Further, when the table may be made to communicate with home appliances or control the home appliances, the display portion 9003 may function as a control device which controls the home appliances by operation on the screen. For example, with the use of the display device having an image sensor function, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 15B illustrates a television device 9100. In the television device 9100, a display portion 9103 is incorporated in a housing 9101 and an image can be displayed on the display portion 9103. Note that the housing 9101 is supported by a stand 9105 here.

The television device 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television device 9100 illustrated in FIG. 15B is provided with a receiver, a modem, and the like. With the receiver, general television broadcasts can be received in the television device 9100. Further, when the television device 9100 is connected to a communication network by wired or wireless connection via the modem, one-way (from a transmitter to a receiver) or two-way (between a transmitter and a receiver or between receivers) data communication can be performed.

Any of the display devices described in the above embodiments can be used for the display portions 9103 and 9107. Thus, the television device can have high display quality.

FIG. 15C illustrates a computer 9200, which includes a main body 9201, a housing 9202, a display portion 9203, a keyboard 9204, an external connection port 9205, a pointing device 9206, and the like.

Any of the display devices described in the above embodiments can be used for the display portion 9203. Thus, the computer can have high display quality.

The display portion 9203 has a touch-input function. When a user touches a keyboard 9204 which are displayed on the display portion 9203 of the computer 9200 with his/her fingers or the like, the user can carry out operation of the screen and input of information. Further, when the table may be made to communicate with home appliances or control the home appliances, the display portion 9203 may function as a control device which controls the home appliances by operation on the screen.

FIGS. 16A and 16B illustrate a foldable tablet terminal. In FIG. 16A, the tablet terminal is opened and includes a housing 9630, a display portion 9631a, a display portion 9631b, a display-mode switching button 9034, a power button 9035, a power-saving-mode switching button 9036, a clip 9033, and an operation button 9038.

Any of the display devices described in the above embodiments can be used for the display portion 9631a and the display portion 9631b. Thus, the display quality of the tablet terminal can be improved.

Part of the display portion 9631a can be a touch panel region 9632a and data can be input when a displayed operation key 9638 is touched. Although a structure in which a half region in the display portion 9631a has only a display function and the other half region also has a touch panel function is illustrated as an example, the structure of the display portion 9631a is not limited thereto. The whole area of the display portion 9631a may have a touch screen function. For example, the whole area of the display portion 9631a can display keyboard buttons and serve as a touch screen while the display portion 9631b can be used as a display screen.

Like the display portion 9631a, part of the display portion 9631b can be a touch screen region 9632b. When a keyboard display switching button 9639 displayed on the touch panel is touched with a finger, a stylus, or the like, a keyboard can be displayed on the display portion 9631b.

Touch input can be performed concurrently on the touch screen regions 9632a and 9632b.

The display-mode switching button 9034 can switch display orientation (e.g., between landscape mode and portrait mode) and select a display mode (switch between monochrome display and color display), for example. The power-saving-mode switching button 9036 can control display luminance in accordance with the amount of external light in use of the tablet terminal detected by an optical sensor incorporated in the tablet. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 16A, one embodiment of the present invention is not limited to this example.

The display portion 9631a and the display portion 9631b may have different areas or different display quality. For example, one of them may be a display panel that can display higher-definition images than the other.

In FIG. 16B, the tablet terminal is folded and includes the housing 9630, a solar cell 9633, and a charge and discharge control circuit 9634. Note that in FIG. 16B, an example in which the charge and discharge control circuit 9634 includes the battery 9635 and the DCDC converter 9636 is illustrated.

Since the tablet can be folded in two, the housing 9630 can be closed when not in use. Thus, the display portions 9631a and 9631b can be protected, thereby providing a tablet with high endurance and high reliability for long-term use.

In addition, the tablet terminal illustrated in FIGS. 16A and 16B can have a function of displaying various kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633, which is attached on the surface of the tablet terminal, supplies electric power to a touch screen, a display portion, an image signal processor, and the like. Note that the solar cell 9633 can be provided on one or both surfaces of the housing 9630, so that the battery 9635 can be charged efficiently. The use of a lithium ion battery as the battery 9635 is advantageous in downsizing or the like.

The structure and operation of the charge and discharge control circuit 9634 illustrated in FIG. 16B are described with reference to a block diagram of FIG. 16C. The solar cell 9633, the battery 9635, the DCDC converter 9636, a converter 9637, switches SW1 to SW3, and the display portion 9631 are shown in FIG. 16C, and the battery 9635, the DCDC converter 9636, the converter 9637, and the switches SW1 to SW3 correspond to the charge and discharge control circuit 9634 in FIG. 16B.

First, an example of the operation in the case where power is generated by the solar cell 9633 using external light is described. The voltage of power generated by the solar battery is raised or lowered by the DCDC converter 9636 so that the power has a voltage for charging the battery 9635. Then, when the power from the solar cell 9633 is used for the operation of the display portion 9631, the switch SW1 is turned on and the voltage of the power is raised or lowered by the converter 9637 so as to be a voltage needed for the display portion 9631. In addition, when display on the display portion 9631 is not performed, the switch SW1 is turned off and a switch SW2 is turned on so that charge of the battery 9635 may be performed.

Note that the solar cell 9633 is described as an example of a power generation means; however, without limitation thereon, the battery 9635 may be charged using another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

Note that the structures and the like described in this embodiment can be combined as appropriate with any of the structures and the like described in the other embodiments.

This application is based on Japanese Patent Application serial no. 2012-202123 filed with Japan Patent Office on Sep. 13, 2012, the entire contents of which are hereby incorporated by reference.

What is claimed is:

1. A display device comprising:
a driver circuit comprising a transistor, the transistor comprising:
a first oxide layer;
a second oxide layer over the first oxide layer; and
a third oxide layer over the second oxide layer;
an insulating layer over the third oxide layer; and
a pixel portion comprising a liquid crystal element, the liquid crystal element comprising:
a first electrode comprising a fourth oxide layer;
the insulating layer over the first electrode;
a second electrode over the insulating layer; and
a liquid crystal layer over the first electrode and the second electrode,
wherein the third oxide layer and the fourth oxide layer are provided in the same layer, and
wherein the second oxide layer comprises a channel formation region of the transistor.

2. The display device according to claim 1, further comprising:
a gate electrode; and
a gate insulating film over the gate electrode,
wherein the second oxide layer is provided apart from the gate insulating film.

3. The display device according to claim 1, wherein the insulating layer comprises silicon nitride.

4. The display device according to claim 1, wherein the first electrode further comprises a fifth oxide layer and a sixth oxide layer.

5. The display device according to claim 1, wherein electron affinity of the second oxide layer is higher than electron affinity of the first oxide layer by 0.2 eV or more.

6. The display device according to claim 1, wherein concentration of aluminum, silicon, titanium, gallium, germanium, yttrium, zirconium, tin, lanthanum, cerium, or hafnium in the first oxide layer is 1.5 times or more as high as that in the second oxide layer.

7. The display device according to claim 1,
wherein the first oxide layer and the second oxide layer are each an In—Ga—Zn-based oxide,
wherein the first oxide layer has an atomic ratio of In:Ga:Zn=$x_1$:$y_1$:$z_1$,
wherein the second oxide layer has an atomic ratio of In:Ga:Zn=$x_2$:$y_2$:$z_2$, and
wherein $y_1/x_1$ is 1.5 times or more as large as $y_2/x_2$.

8. The display device according to claim 1, wherein the second oxide layer comprises a crystalline structure.

9. The display device according to claim 1, wherein one of the first electrode and the second electrode is a common electrode of the liquid crystal element.

10. An electronic appliance comprising the display device according to claim 1.

11. A display device comprising:
a driver circuit comprising a transistor, the transistor comprising:
a first oxide layer;
a second oxide layer over the first oxide layer; and
a third oxide layer over the second oxide layer,
a first insulating layer over the third oxide layer;
a second insulating layer over the first insulating layer; and
a pixel portion comprising a liquid crystal element, the liquid crystal element comprising:
a first electrode comprising a fourth oxide layer;
the first insulating layer over the first electrode;
the second insulating layer over the first insulating layer;

a second electrode in contact with the second insulating layer; and a liquid crystal layer over the first electrode and the second electrode, wherein the third oxide layer and the fourth oxide layer are provided in the same layer, and wherein the second oxide layer comprises a channel formation region of the transistor.

12. The display device according to claim 11, further comprising:

a gate electrode; and a gate insulating film over the gate electrode, wherein the second oxide layer is provided apart from the gate insulating film.

13. The display device according to claim 11, wherein the first insulating layer comprises silicon nitride, and wherein the second insulating layer comprises an organic resin.

14. The display device according to claim 11, wherein the first electrode further comprises a fifth oxide layer and a sixth oxide layer.

15. The display device according to claim 11, wherein electron affinity of the second oxide layer is higher than electron affinity of the first oxide layer by 0.2 eV or more.

16. The display device according to claim 11, wherein concentration of aluminum, silicon, titanium, gallium, germanium, yttrium, zirconium, tin, lanthanum, cerium, or hafnium in the first oxide layer is 1.5 times or more as high as that in the second oxide layer.

17. The display device according to claim 11, wherein the first oxide layer and the second oxide layer are each an In—Ga—Zn-based oxide, wherein the first oxide layer has an atomic ratio of In:Ga:Zn=$x_1$:$y_1$:$z_1$, wherein the second oxide layer has an atomic ratio of In:Ga:Zn=$x_2$:$y_2$:$z_2$, and wherein $y_1/x_1$ is 1.5 times or more as large as $y_2/x_2$.

18. The display device according to claim 11, wherein the second oxide layer comprises a crystalline structure.

19. The display device according to claim 11, wherein one of the first electrode and the second electrode is a common electrode of the liquid crystal element.

20. An electronic appliance comprising the display device according to claim 11.

* * * * *